United States Patent [19]
Matsumoto et al.

[11] Patent Number: 5,559,474
[45] Date of Patent: Sep. 24, 1996

[54] FREQUENCY SYNTHESIZER WITH CONTROLLABLE LOOP FILTER

[75] Inventors: Takayuki Matsumoto, Kadoma; Hisashi Adachi, Mino; Hiroaki Kosugi, Hirakata; Makoto Sakakura, Uji, all of Japan

[73] Assignee: Matsushita Electric Industrial Co., Ltd., Japan

[21] Appl. No.: 450,895

[22] Filed: May 26, 1995

[30] Foreign Application Priority Data

May 26, 1994 [JP] Japan .................. 6-113055
Aug. 22, 1994 [JP] Japan .................. 6-196429

[51] Int. Cl.$^6$ .............. H03L 7/08; H03L 7/093; H03L 7/099; H03L 7/18
[52] U.S. Cl. .......... 331/17; 331/8; 331/14; 331/16; 331/23; 331/36 C; 331/177 V; 332/127; 327/157; 327/105; 455/260
[58] Field of Search .................. 331/1 A, 8, 14, 331/16, 17, 23, 36 C, 173, 179, DIG. 2, 177 V; 332/127, 128; 327/105, 107, 156–159; 455/260

[56] References Cited

U.S. PATENT DOCUMENTS

| | | |
|---|---|---|
| 4,433,308 | 2/1984 | Hirata ......................... 331/17 |
| 4,510,461 | 4/1985 | Dickes et al. ............... 331/17 X |
| 4,980,653 | 12/1990 | Shepherd .................... 331/17 X |
| 5,053,724 | 10/1991 | Ogino et al. ................ 331/17 X |
| 5,095,288 | 3/1992 | Dent ........................... 331/17 |
| 5,302,919 | 4/1994 | Abe ............................ 331/17 X |
| 5,334,954 | 8/1994 | Koblitz et al. ............. 331/17 X |
| 5,420,545 | 5/1995 | Davis et al. ................ 331/17 |

*Primary Examiner*—David Mis
*Attorney, Agent, or Firm*—Beveridge, DeGrandi, Weilacher & Young, L.L.P.

[57] ABSTRACT

In accordance with a loop open/close control signal, an analog switch closes or opens a loop including a voltage controlled oscillator, a variable frequency divider, a phase comparator, and a first loop filter, the analog switch, and a second loop filter. In order to reduce the change of frequency caused when the open loop state is set immediately after the output frequency is changed, the second loop filter uses a capacitor which shows properties of a small change of capacitance in response to an applied voltage and a small hysteresis. In another embodiment, the voltage controlled oscillator includes a second diode, one terminal of which is grounded, connected in reverses parallel to a first diode switch which switches the output oscillation frequency ranges of the voltage controlled oscillator.

23 Claims, 18 Drawing Sheets

INPUT VOLTAGE OF FIRST CONTROL TERMINAL OF VOLTAGE CONTROLLED OSCILLATOR

THRESHOLD OF CONTROL VOLTAGE
OF ANALOG SWITCH

FREQUENCY SYNTHESIZER WITH CONTROLLABLE LOOP FILTER

BACKGROUND OF THE INVENTION

1. Field of the Invention

The invention relates to a high-frequency circuit for a radio apparatus.

2. Related Art of the Invention

A frequency synthesizer in which loop filters are switched in accordance with the oscillation frequency of a VCO (Voltage Controlled Oscillator) has been proposed in U.S. patent application Ser. No. 682,255. In the synthesizer, a signal obtained by dividing the oscillation frequency of the VCO by a frequency divider, and an output signal of a reference oscillator are input to a phase comparator, and an error signal corresponding to the phase difference between the two signals is input to the VCO through the loop filter as a control signal. In this way, a feedback loop is formed so that an output signal is obtained at the same accuracy as that of the reference signal. The oscillation frequency is changed by changing the division ratio of the frequency divider. According to the invention of the above-mentioned patent application, when the oscillation frequency is changed, loop filters can be switched in accordance with the changed oscillation frequency, thereby enabling the synthesizer to always output a signal of a high accuracy.

However, the proposed synthesizer has several points which remain to be improved. First, a case will be considered where a VCO in which output oscillation frequency bands can be switched by an external control signal is used. In this case, loop filters must be switched so as to conform not only to the frequency obtained as a result of the switching operation and also to the sensitivity of the VCO attained after the switching operation. Next, a case will be considered where the synthesizer is provided with a frequency modulation function using a digital modulation signal. In this case, particularly when a modulation signal of a high bit rate is used, modulation cannot be performed while the feedback loop of the synthesizer is closed. Also in this case, modulation must be performed by using the open-loop modulation system in which the feedback loop is opened only during the modulation process. In the case of using the open-loop modulation system, however, the open-loop modulation cannot satisfactorily be performed by a filter which conforms only to a mere frequency change. In order to satisfactorily perform the open-loop modulation, the VCO must be designed so as to exhibit a small frequency change even in an open loop state.

SUMMARY OF THE INVENTION

It is an object of the invention to provide a synthesizer in which loop filters respectively corresponding to sensitivities are used so that, even when a VCO attaining plural output frequency ranges is used, an output can accurately be obtained, and which, even when a modulation signal of a high bit rate is used, can perform digital frequency modulation.

The frequency synthesizer of the invention comprises a VCO in which transmission oscillation frequency ranges can be switched by an external control signal, and a loop filter which, even in the case where the output oscillation frequency ranges of the VCO are switched and the sensitivity of the VCO is changed, conforms to the change of the sensitivity. Also in this case, therefore, the synthesizer can obtain an output signal of a high accuracy.

A synthesizer having a preferred configuration comprises:

a VCO in which output oscillation frequency ranges can be switched by an external control signal;

a branch circuit which takes out a part of an output signal of the VCO, as a branch signal;

a frequency divider which divides the frequency of a branch output into a frequency of a reference signal;

a phase comparator which compares the phase of a frequency-division output with the phase of the reference signal;

a loop filter which limits the band of an output signal of the phase comparator and supplies the band-limited output signal to the VCO as a VCO control signal; and a loop switch which is disposed between the phase comparator and the loop filter, and which can open a feedback loop.

More preferably, a capacitor constituting a portion between an analog switch which closes and opens the feedback loop and the voltage controlled oscillator is a laminated film capacitor which shows properties of a small change of the capacitance in response to an applied voltage and a small hysteresis. Even when the feedback loop is opened immediately after the output oscillation frequency ranges of the VCO are switched, therefore, the change of the oscillation frequency is small.

More preferably, a first diode switch, which switches the output oscillation frequency ranges of the VCO, and a second diode, one terminal of which is grounded, are connected in reverse. Even when the feedback loop is opened immediately after the output oscillation frequency ranges of the VCO are switched, therefore, the change of the oscillation frequency is small.

DESCRIPTION OF THE PREFERRED EMBODIMENTS

Figure 1:
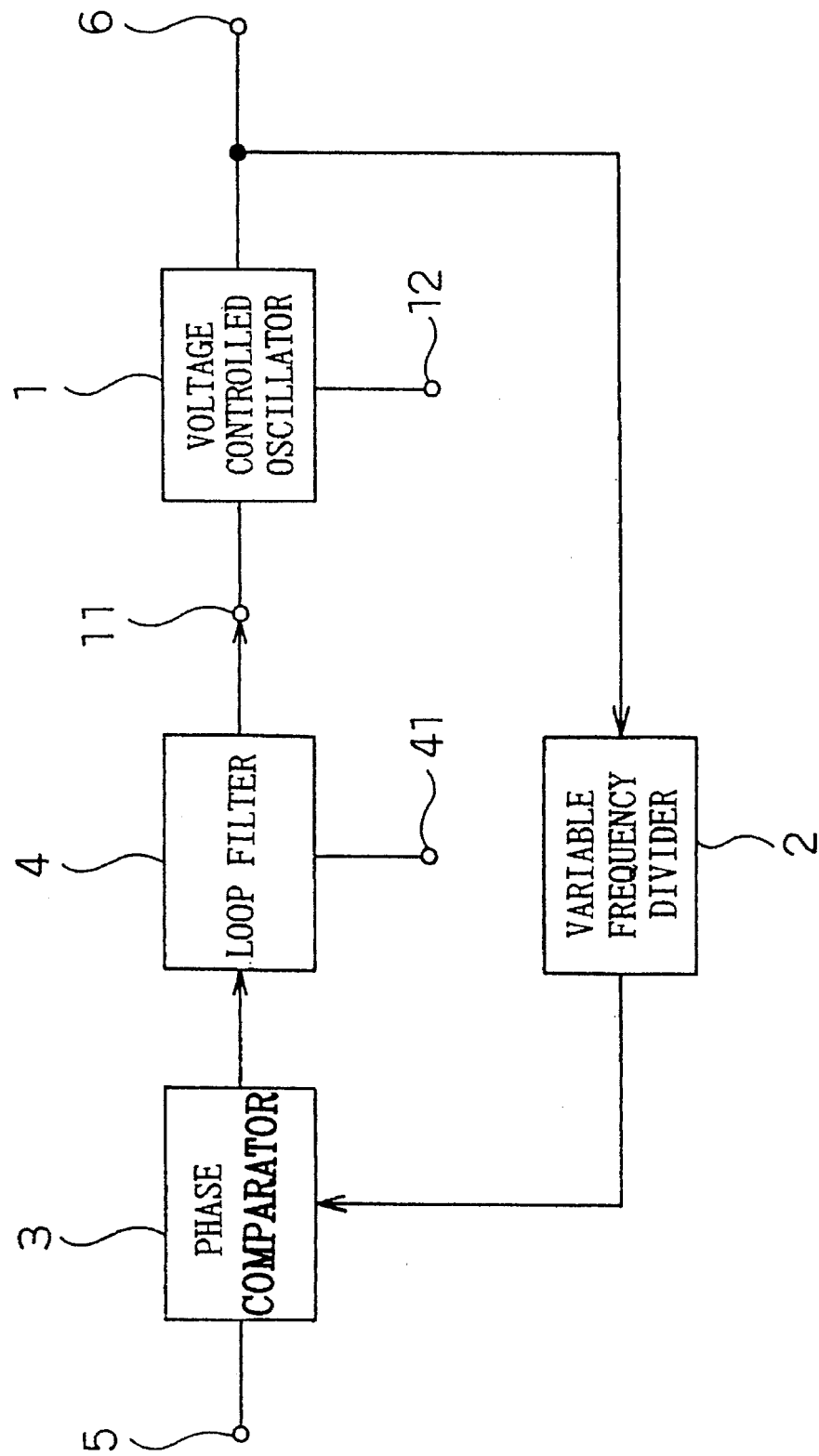
FIG. 1 is a block diagram of a frequency synthesizer of a first embodiment of the invention.

FIG. 1 is a block diagram of a frequency synthesizer of a first embodiment of the invention. In FIG. 1, 1 designates a voltage controlled oscillator in which oscillation frequency ranges are switched in accordance with a switch control signal input through a second control terminal 12, 11 designates a first control terminal through which a control signal for changing the oscillation frequency of the voltage controlled oscillator 1 in the oscillation frequency range is input, 2 designates a variable frequency divider which variably divides the frequency of an output signal of the voltage controlled oscillator 1, 3 designates a phase comparator which compares an output signal from the variable frequency divider 2 with a reference frequency signal input through a reference frequency input terminal 5 and functioning as the reference of the frequency, 4 designates a loop filter in which the filter response characteristics can be changed in accordance with a control signal input through a loop filter control terminal 41, and 6 designates an output terminal of the voltage controlled oscillator 1. The frequency ranges of the voltage controlled oscillator 1 are switched by, for example, a method in which resonance circuits each consisting of a coil, a capacitor, and the like in an oscillation circuit are switched by a switch operated in accordance with a switch control signal.

Figure 2:
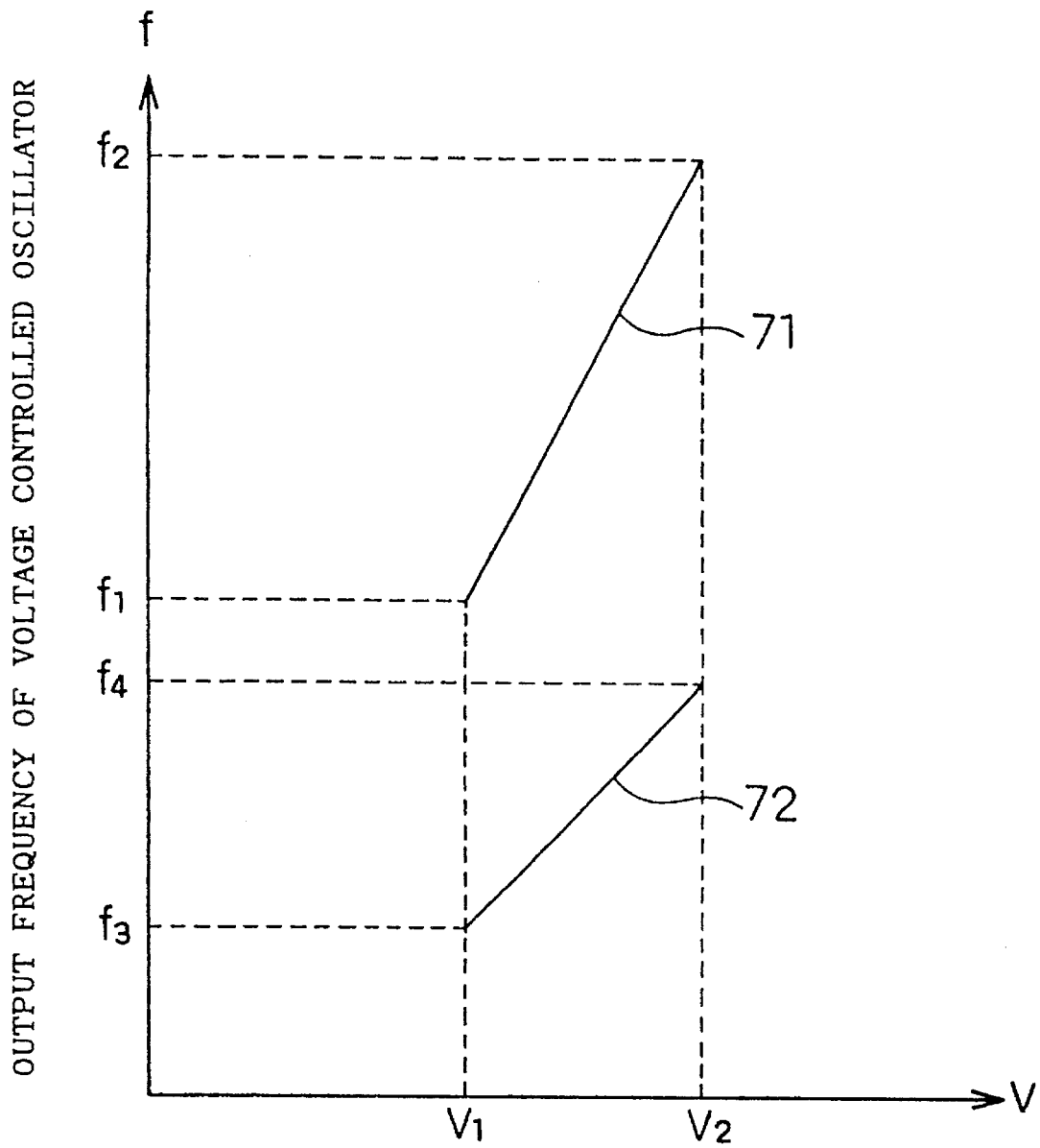
FIG. 2 is a graph showing input-output characteristics of a voltage controlled oscillator used in the first embodiment of the invention.

Hereinafter, the operation of the frequency synthesizer shown in FIG. 1 will be described. FIG. 2 shows the characteristics of the voltage controlled oscillator 1. In FIG. 2, the abscissa indicates the control voltage input through the first control terminal 11 of the voltage controlled oscillator 1, and the ordinate indicates the output frequency of the voltage controlled oscillator 1. In the embodiment, oscillation frequencies in two oscillation frequency regions are switched in accordance with the switch control signal input through the second control terminal 12. Specifically, when an input-output characteristic 71 is selected by the switch control signal input through the second control terminal 12, the output frequency of the voltage controlled oscillator is changed from f1 to f2 by changing the voltage of the first control signal from V1 to V2. When an input-output characteristic 72 is selected by the switch control signal, the output frequency of the voltage controlled oscillator is changed from f3 to f4 by changing the voltage of the first control signal from V1 to V2. The output of the voltage controlled oscillator 1 which is obtained as a result of the above-mentioned control is branched. One of the branches is output through the output terminal 6, and the other branch is input to the variable frequency divider 2. The frequency of the signal input to the variable frequency divider 2 is divided, and the resulting signal is input to the phase comparator 3 together with the reference frequency signal input to the reference frequency input terminal 5. Thereafter, a signal corresponding to the phase difference between the two frequency signals is input to the loop filter 4. In accordance with the control signal input to the loop filter control terminal 41, the response characteristics of the loop filter 4 are controlled so as to correspond to the sensitivity which is the slope of the characteristic (71 or 72) of the voltage controlled oscillator 1 shown in FIG. 2. Then the output signal of the loop filter 4 is input as the first control signal of the voltage controlled oscillator 1, thereby constituting a feedback loop.

Figure 3:
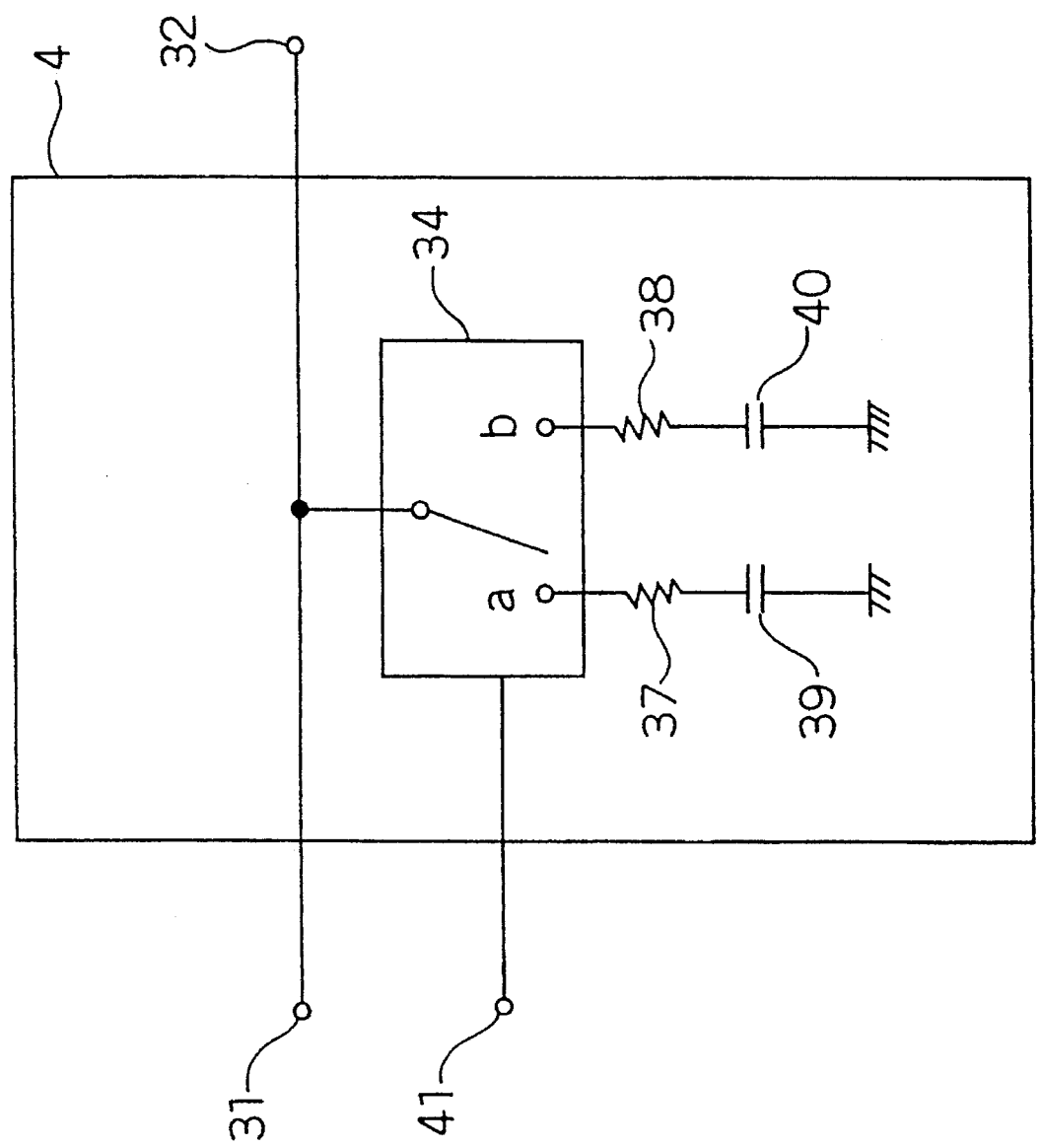
FIG. 3 is a block diagram of a loop filter used in the frequency synthesizer of the first embodiment of the invention.

FIG. 3 is a block diagram showing the configuration of the loop filter used in the frequency synthesizer of the embodiment. In FIG. 3, 31 designates a loop filter input terminal, 32 designates a loop filter output terminal, 34 designates an analog switch, 39 and 40 designate capacitors, 37 and 38 designate resistors, and 41 designates the loop filter control terminal.

In accordance with the control signal input to the loop filter control terminal 41, the operation state of the switch 34 is selectively changed over so that a loop filter band corresponding to the sensitivity of the voltage controlled oscillator 1 is realized. When a terminal a is selected by the switch 34, the signal input to the loop filter input terminal 31 is limited by the loop band according to the capacitor 39 and the resistor 37, and then output through the loop filter output terminal 32. In contrast, when a terminal b is selected by the switch 34, the signal input to the loop filter input terminal 31 is limited by the loop band according to the capacitor 40 and the resistor 38, and then output through the loop filter output terminal 32.

As seen from the above description, according to the first embodiment, even when the input-output sensitivity of the voltage controlled oscillator 1 in which the oscillation frequency ranges can be switched is changed, it is possible to realize a loop filter corresponding to the change of the input-output sensitivity of the voltage controlled oscillator 1. Consequently, the time required for changing the channel can be optimized.

Next, a second embodiment of the invention will be described with reference to the drawings.

Figure 4:
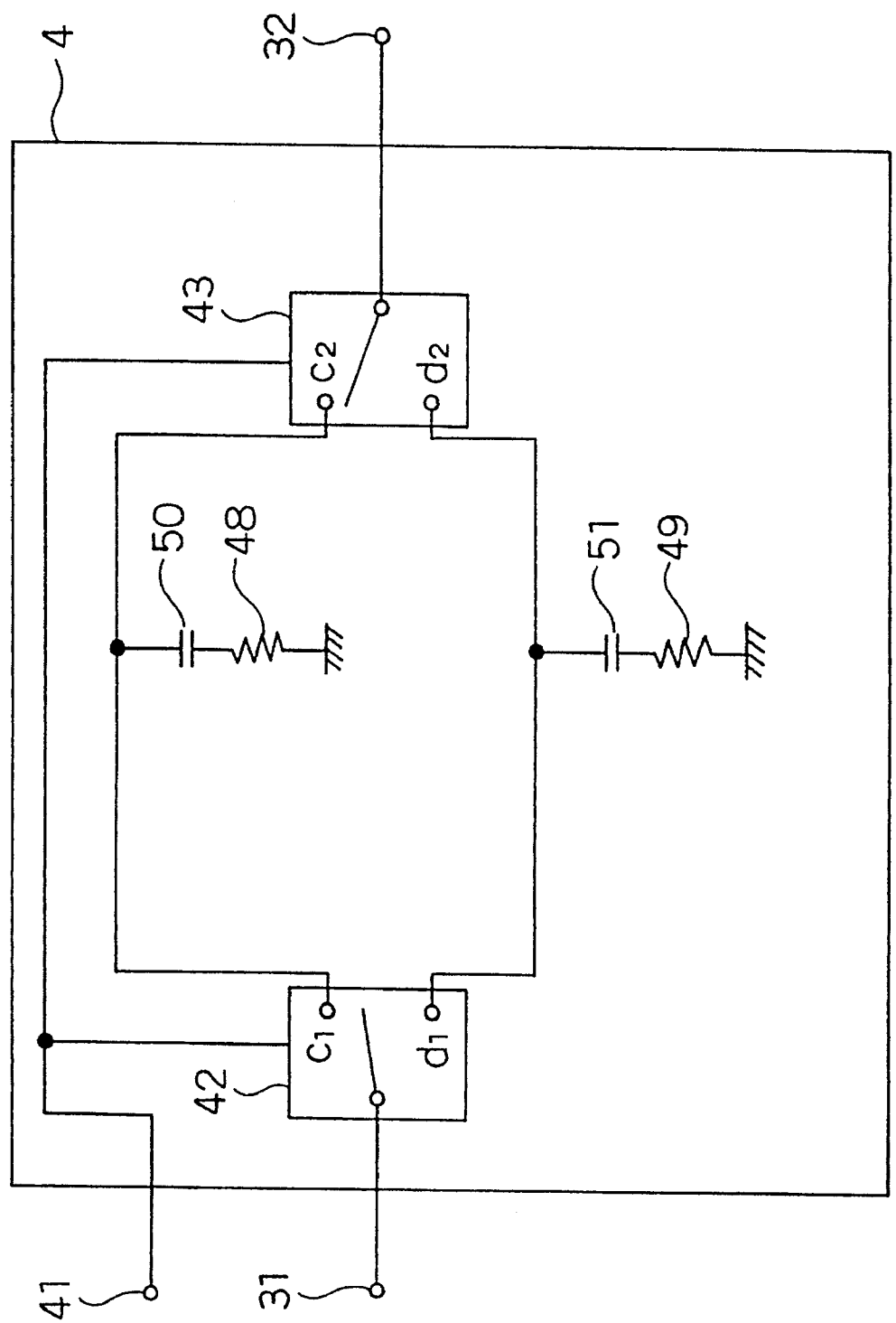
FIG. 4 is a block diagram of a loop filter used in a frequency synthesizer of a second embodiment of the invention.

FIG. 4 is a block diagram of a loop filter used in the frequency synthesizer of the second embodiment of the invention. The embodiment is basically configured in the same manner as the first embodiment of FIG. 1. The devices, circuit elements, and the like identical or equivalent to those shown in FIG. 1 are designated by the same reference numerals, and duplicated description is omitted. In FIG. 4, analog switches 42 and 43 are disposed in the input and output sides of the loop filter 4, respectively. The analog switches 42 and 43 switch over series circuits of a capacitor 50 and a resistor 48, and a capacitor 51 and a resistor 49.

The operation of the frequency synthesizer of the second embodiment will be described with reference to the drawings.

The analog switches 42 and 43 are switched by the control signal input through the loop filter control terminal 41, so that a loop band corresponding to the sensitivity of the voltage controlled oscillator 1 is realized. When a terminal c1 is selected by the analog switch 42 and a terminal c2 is selected by the analog switch 43, the signal input to the loop filter input terminal 31 is limited by the loop band according to the capacitor 50 and the resistor 48, and then output through the loop filter output terminal 32. In contrast, when a terminal d1 is selected by the analog switch 42 and a terminal d2 is selected by the analog switch 43, the signal input to the loop filter input terminal 31 is limited by the loop band according to the capacitor 51 and the resistor 49, and then output through the loop filter output terminal 32.

As seen from the above description, according to the second embodiment of the invention, it is possible to realize a loop filter corresponding to the change of the input-output sensitivity of the voltage controlled oscillator 1.

Next, a third embodiment of the invention will be described with reference to the drawings.

Figure 5:
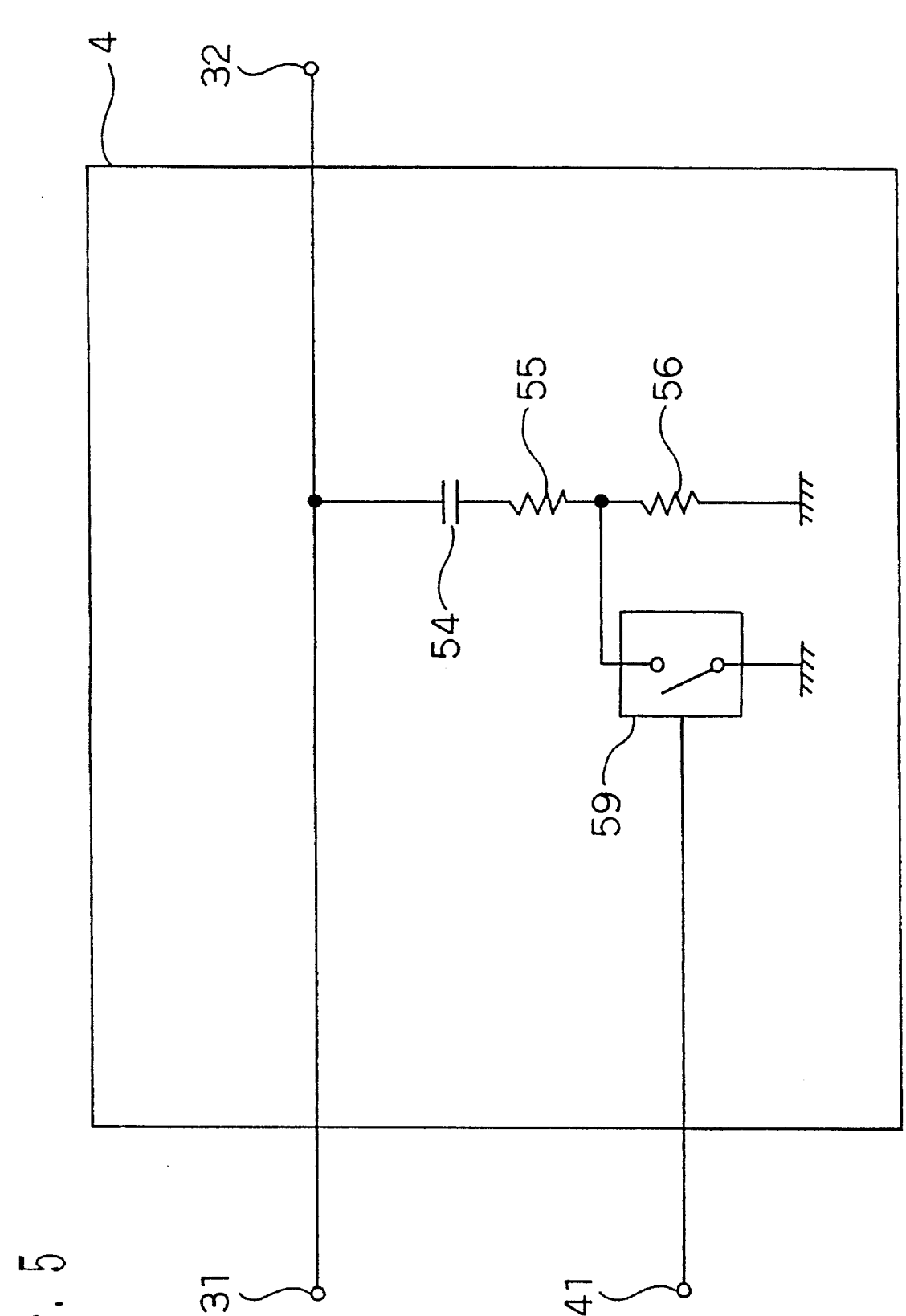
FIG. 5 is a block diagram of a loop filter used in a frequency synthesizer of a third embodiment of the invention.

FIG. 5 is a block diagram of a loop filter used in the frequency synthesizer of the third embodiment of the invention. The devices, circuit elements, and the like identical or equivalent to those shown in FIGS. 1 and 3 are designated by the same reference numerals, and duplicated description is omitted. In FIG. 5, 59 designates a switch, 54 designates a capacitor, and 55 and 56 designate resistors. In the embodiment, response characteristics are switched by bypassing the resistor 56 by means of the switch 59.

The operation of the frequency synthesizer of the third embodiment will be described with reference to the drawings.

The ON/OFF state of the switch 59 is controlled by the control signal input through the loop filter control terminal 41, so that loop filter response characteristics corresponding to the sensitivity of the voltage controlled oscillator 1 are realized. In the embodiment, when the switch 59 is ON, the signal input through the input terminal 31 is limited by the loop band according to the capacitor 54 and the resistor 55, and then output through the output terminal 32. In contrast, when the switch 59 is OFF, the signal input through the loop filter input terminal 31 is limited by the loop band according to the capacitor 54 and the resistors 55 and 56, and then output through the output terminal 32.

As seen from the above description, according to the third embodiment of the invention, a loop filter corresponding to the change of the input-output sensitivity of the voltage controlled oscillator 1 can be realized by a simple circuit configuration.

Next, a fourth embodiment of the invention will be described with reference to the drawings.

Figure 6:
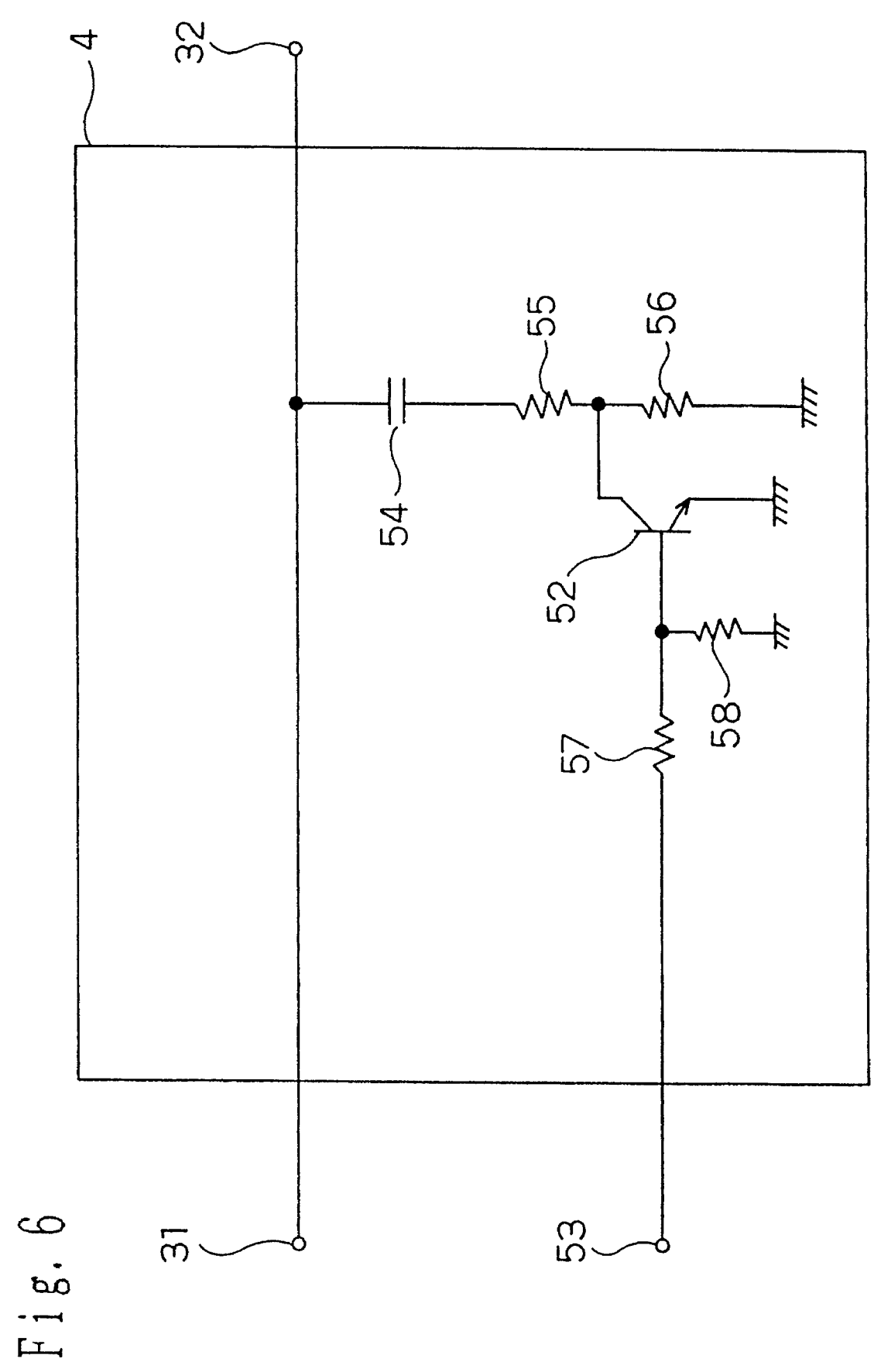
FIG. 6 is a block diagram of a loop filter used in a frequency synthesizer of a fourth embodiment of the invention.

FIG. 6 is a block diagram of a loop filter used in the frequency synthesizer of the fourth embodiment of the invention. The devices, circuit elements, and the like identical or equivalent to those shown in FIGS. 1, 3, and 5 are designated by the same reference numerals, and duplicated description is omitted. In FIG. 6, 52 designates a transistor, 53 designates a transistor control terminal, and 57 and 58 designate resistors. In other words, the switch 59 of FIG. 5 is realized by using the transistor 52. The transistor control terminal 53 corresponds to the loop filter control terminal 41.

The operation of the frequency synthesizer of the fourth embodiment will be described with reference to the drawings.

The turn-ON/turn-OFF state of the transistor 52 is controlled by the control signal input through the transistor control terminal 53, so that loop filter response characteristics corresponding to the sensitivity of the voltage controlled oscillator 1 are realized. When the transistor 52 is turned ON, the signal input through the input terminal 31 is limited by the loop band according to the capacitor 54 and the resistor 55, and then output through the output terminal 32. In contrast, when the transistor 52 is turned OFF, the signal input through the loop filter input terminal 31 is limited by the loop band according to the capacitor 54 and the resistors 55 and 56, and then output through the loop filter output terminal 32.

As seen from the above description, according to the fourth embodiment of the invention, a loop filter corresponding to the change of the input-output sensitivity of the voltage controlled oscillator 1 can be realized by a simple circuit configuration.

According to the invention, the use of the voltage controlled oscillator 1 in which output oscillation frequency ranges can be switched by an external control signal allows the single voltage controlled oscillator 1 to output two or more frequency ranges, and the response characteristics of the loop filter 4 can be changed in conformity to the sensitivity which is a ratio of the output frequency to the input voltage of the voltage controlled oscillator 1 in each output oscillation frequency range. Consequently, the time required for changing the C/N ratio and the channel can be optimized.

In the embodiments described above, the voltage controlled oscillator and the loop filter are configured so as to switch two frequency ranges. The invention is not restricted to this, and may be applied to a configuration in which three or more frequency ranges are switched.

In the embodiments, the slope in a higher frequency region of the sensitivity characteristics of the voltage controlled oscillator is greater than that in a lower frequency region. The invention may be applied to a configuration in which, contrary to the embodiments, the slope in a higher frequency region is smaller than that in a lower frequency region.

In the embodiments, a resistor and a capacitor which are connected in series are used as filter elements of the loop filter. The invention is not restricted to this, and may be applied to a configuration in which a passive element(s) of another kind, such as an inductor or an active element(s) such as a semiconductor device are used as far as the element(s) can attain desired filter response characteristics. Alternatively, the manner of connecting these elements is not restricted to a series connection.

In the fourth embodiment, a transistor is used as the switch. The invention is not restricted to this. Alternatively, a semiconductor device of another kind may be used as far as the device can exhibit a controllable switch function.

The circuit configuration of the loop filter is not restricted to that described in the embodiments, as far as it can change the filter response characteristics so as to conform to the sensitivity of the switched frequency range in accordance with the switch control signal of the voltage controlled oscillator.

Next, a fifth embodiment of the invention will be described with reference to the drawings.

Figure 7:
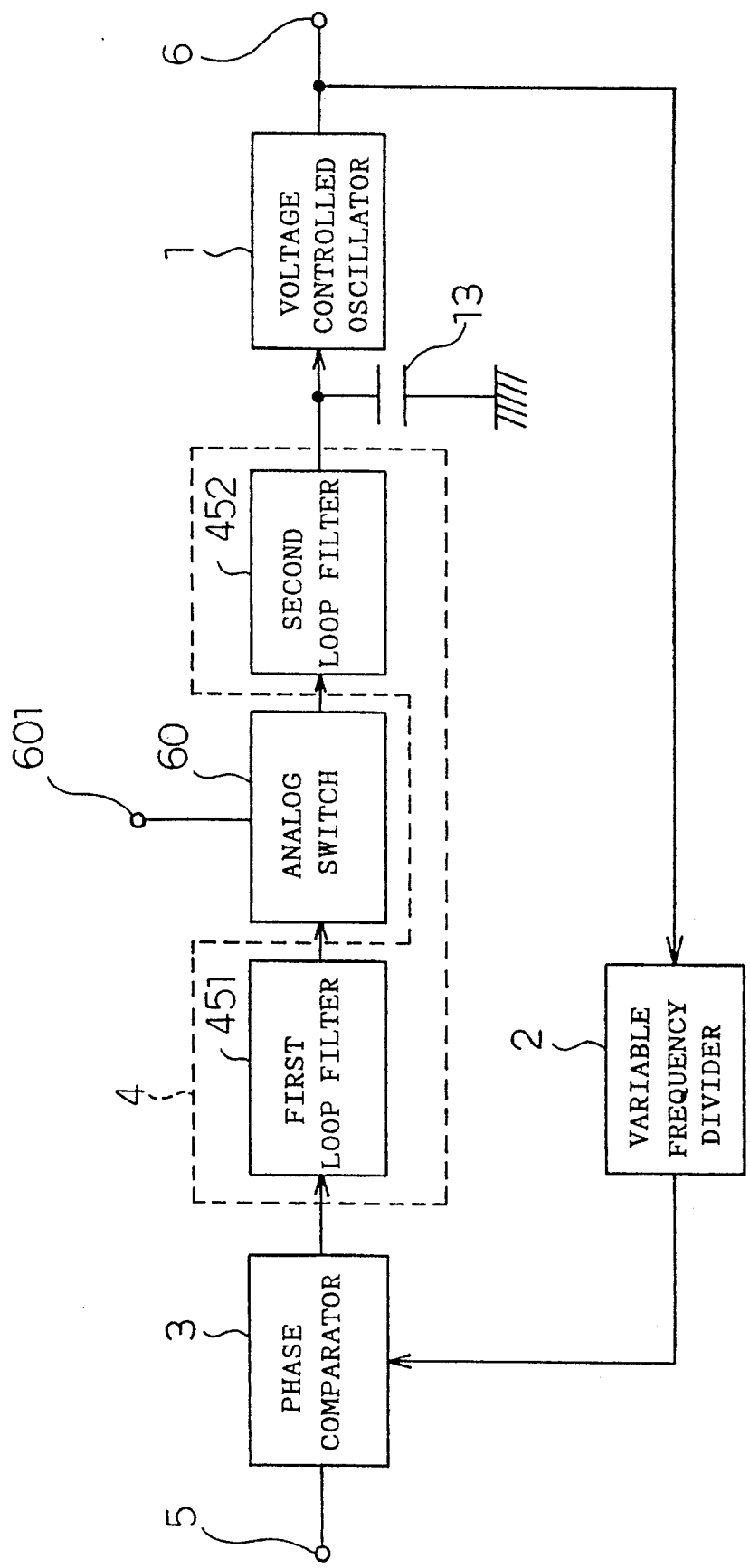
FIG. 7 is a block diagram of a frequency synthesizer of a fifth embodiment of the invention.

FIG. 7 is a block diagram of a frequency synthesizer of a fifth embodiment of the invention. In FIG. 7, 1 designates a voltage controlled oscillator, 13 designates a high-frequency grounding capacitor, 2 designates a variable frequency divider, 3 designates a phase comparator, 5 designates a reference frequency input terminal, 4 designates a loop filter, 451 designates a first loop filter, 452 designates a second loop filter, 60 designates an ON/OFF switch which is a semiconductor analog switch, 601 designates a loop open/close control signal input terminal, and 6 designates an output terminal.

The operation of the thus configured frequency synthesizer of the fifth embodiment will be described with reference to FIG. 7.

The output signal of the voltage controlled oscillator 1 is branched. One of the branched signals is output through the output terminal 6, and the other branched signal is input to the variable frequency divider 2. The frequency of the signal input to the variable frequency divider 2 is divided, and the resulting signal is input to the phase comparator 3 together with the reference frequency signal input to the reference frequency input terminal 5. Thereafter, a signal corresponding to the phase difference between the two input signals is input to the first loop filter 451 of the loop filter 4. The output signal of the first loop filter 451 is input to the analog switch 60, and the output signal of the analog switch 60 is input to the second loop filter 452. The output signal of the second loop filter 452 is input to the voltage controlled oscillator 1 as the control signal voltage, thereby constituting a feedback loop. In the embodiment, the high-frequency grounding capacitor 13 operates to prevent a high frequency signal of the voltage controlled oscillator from being transmitted toward the loop filter.

A loop open/close control signal is input to the loop open/close control signal input terminal 601 so as to control the ON/OFF state of the ON/OFF switch 60, thereby controlling the open/close state of the feedback loop.

Among capacitors existing between the analog switch 60 and the voltage controlled oscillator 1, all the capacitors except the high-frequency grounding capacitor 13 are laminated film capacitors which show properties of a small change of the capacitance in response to an applied voltage and a small hysteresis.

Namely, a capacitor constituting the second loop filter 452 is a laminated film capacitor.

As a result, all the capacitors existing between the analog switch 60 and the voltage controlled oscillator 1, except the high-frequency grounding capacitor 13 exhibit a small change of the capacitance with respect to the change of the voltage of the control signal of the voltage controlled oscillator 1. Even when the open loop state is set immediately after the switching of the frequency, therefore, the change of the control signal voltage of the voltage controlled oscillator 1 can be made small so that the change of the frequency of the output signal of the voltage controlled oscillator 1 is small.

As seen from the above description, according to the fifth embodiment of the invention, even when the open loop state is set immediately after the switching of the frequency, the change of the control signal voltage of the voltage controlled oscillator 1 is small and hence the change of the frequency of the output signal of the voltage controlled oscillator 1 is small.

Next, a sixth embodiment of the invention will be described with reference to the drawings.

Figure 8:
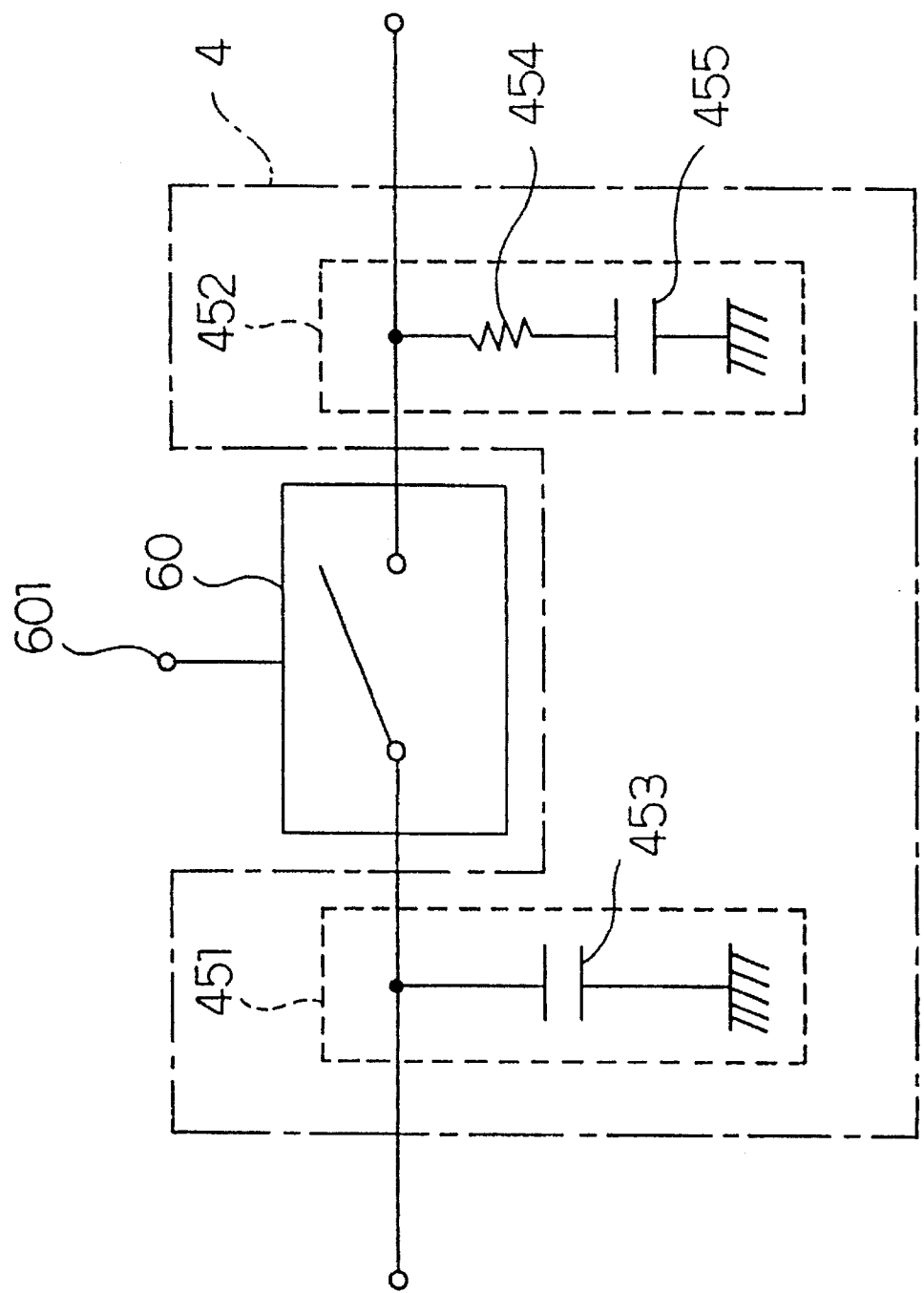
FIG. 8 is a block diagram showing the configuration of a loop filter and analog switch used in a frequency synthesizer of a sixth embodiment of the invention.

FIG. 8 is a block diagram showing the configuration of a loop filter and an analog switch used in the sixth embodiment of the invention.

The embodiment is basically configured in the same manner as the fifth embodiment. Therefore, the devices, circuit elements, and the like identical or equivalent to those shown in FIG. 7 are designated by the same reference numerals, and duplicated description is omitted.

In FIG. 8, 453 and 455 designate capacitors, and 454 designates a resistor.

The operation of the thus configured frequency synthesizer of the sixth embodiment will be described with reference to the figure.

The output signal of the phase comparator 3 is input to the first loop filter 451, smoothed by the capacitor 453, and then input to the analog switch 60. The output of the analog switch 60 is input to the second loop filter 452, smoothed by the resistor 454 and the capacitor 455, and then input to the voltage controlled oscillator 1 as the control signal voltage.

Among the capacitors existing between the analog switch 60 and the voltage controlled oscillator 1, all capacitors except the high-frequency grounding capacitor 13 are laminated film capacitors. Even when the open loop state is set immediately after the switching of the frequency, therefore, all the capacitors existing between the analog switch 60 and the voltage controlled oscillator 1, except the high-frequency grounding capacitor 13 exhibit a small change of the capacitance. Therefore, the change of the control signal voltage of the voltage controlled oscillator 1 can be made small so that the change of the frequency of the output signal of the voltage controlled oscillator 1 is small.

As seen from the above description, according to the sixth embodiment of the invention, even when the open loop state is set immediately after the switching of the frequency, the change of the control signal voltage of the voltage controlled oscillator 1 is small and hence the change of the frequency of the output signal of the voltage controlled oscillator 1 is small.

According to the embodiment, moreover, when the analog switch 60 is opened, the voltage across the analog switch 60 is held by the capacitors 453 and 455, and hence the switching noise is low in level.

Alternatively, the first and second loop filters 451 and 452 may be replaced with each other. In this alternative, the capacitor 453 is a laminated film capacitor.

Next, a seventh embodiment of the invention will be described with reference to the drawings.

Figure 9:
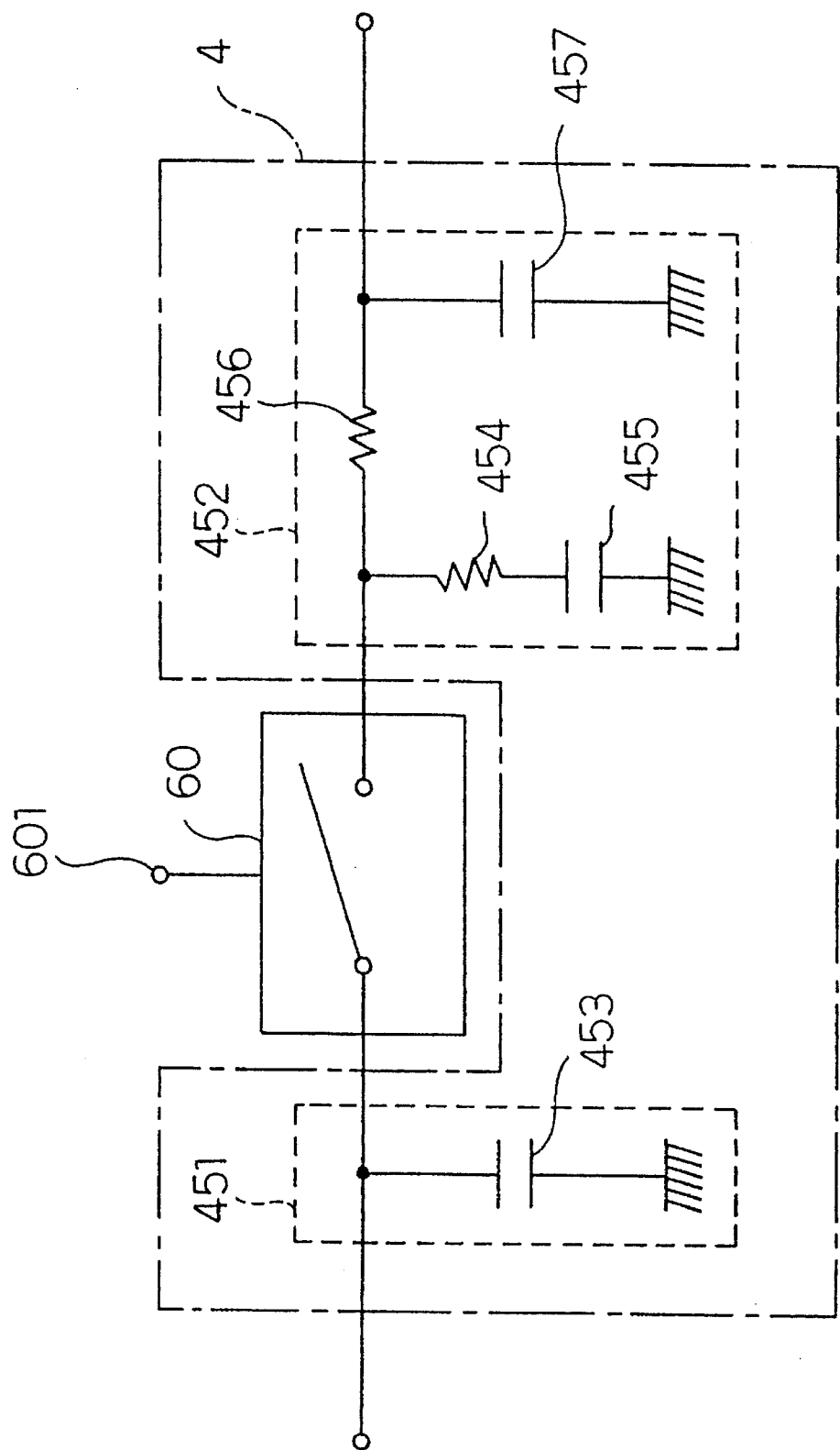
FIG. 9 is a block diagram showing the configuration of a loop filter and an analog switch used in a frequency synthesizer of a seventh embodiment of the invention.

FIG. 9 is a diagram showing the configuration of a loop filter and an analog switch used in the seventh embodiment of the invention.

In FIG. 9, the devices, circuit elements, and the like identical or equivalent to those shown in FIGS. 7 and 8 are designated by the same reference numerals, and duplicated description is omitted.

In the embodiment shown in FIG. 9, 456 designates a resistor, and 457 designates a capacitor.

The operation of the thus configured frequency synthesizer of the seventh embodiment will be described with reference to FIG. 9.

The output signal of the phase comparator 3 is input to the first loop filter 451, smoothed by the capacitor 453, and then input to the analog switch 60. The output of the analog switch 60 is input to the second loop filter 452, and smoothed by the resistors 454 and 456 and the capacitors 455 and 457. The smoothed signal is then input to the voltage controlled oscillator 1 as the control signal voltage. The capacitors 455 and 457 are laminated film capacitors which show properties of a small change of the capacitance in response to an applied voltage and a small hysteresis.

As a result, all the capacitors existing between the analog switch 60 and the voltage controlled oscillator 1, except the high-frequency grounding capacitor 13 exhibit a small change of the capacitance with respect to the change of the voltage of the control signal of the voltage controlled oscillator 1. Even when the open loop state is set immediately after the switching of the frequency, therefore, the change of the control signal voltage of the voltage controlled oscillator 1 can be made small so that the change of the frequency of the output signal of the voltage controlled oscillator 1 is small.

As seen from the above description, according to the seventh embodiment of the invention, even when the open loop state is set immediately after the switching of the frequency, the change of the capacitance of the capacitors constituting the loop filter is small. Therefore, the change of the control signal voltage of the voltage controlled oscillator can be made small so that the change of the frequency of the output signal of the voltage controlled oscillator is small.

According to the embodiment, moreover, noise can further be reduced in level by the low-pass filter consisting of the resistor 456 and the capacitor 457.

Next, an eighth embodiment of the invention will be described with reference to the drawings.

Figure 10:
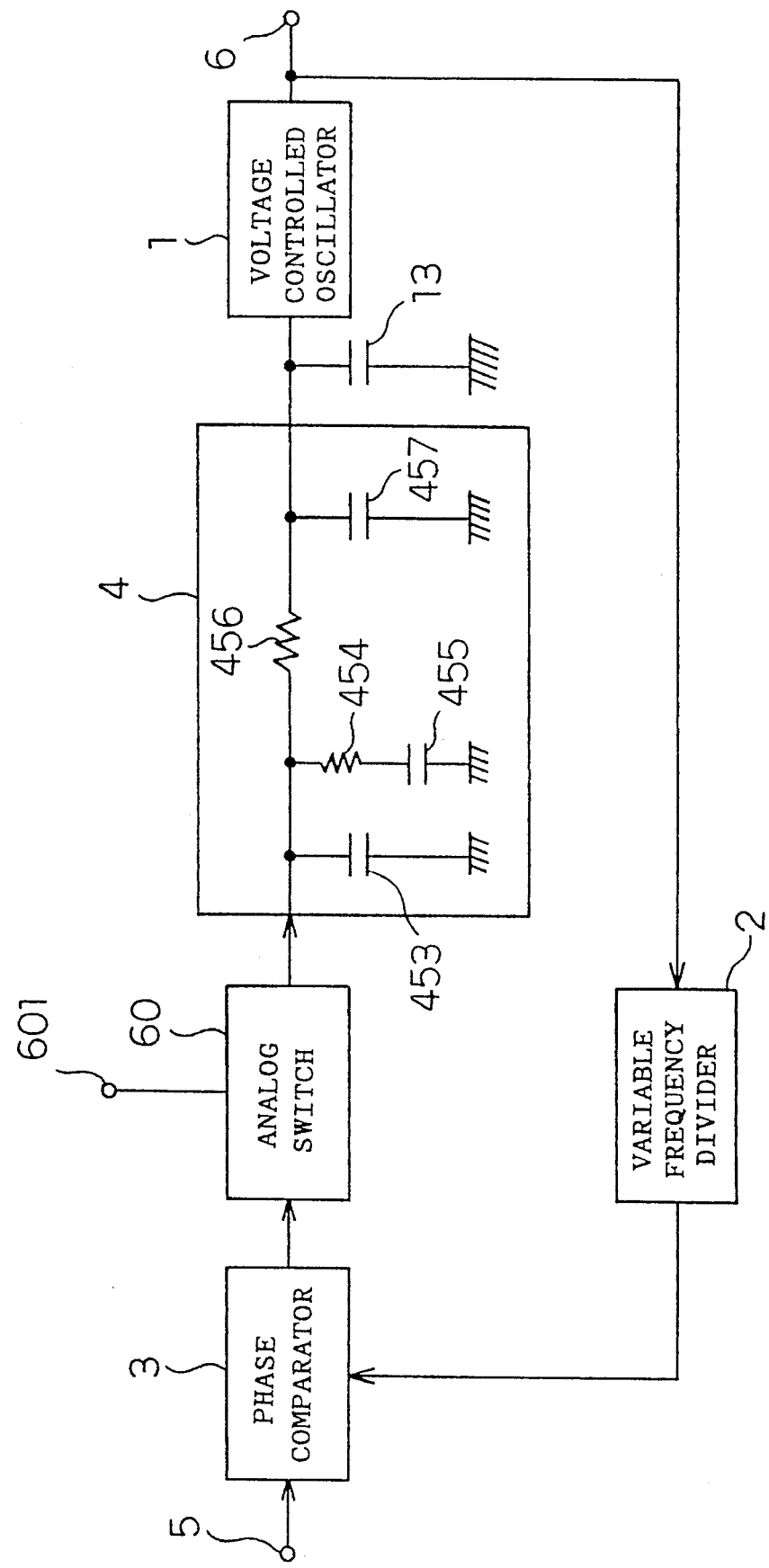
FIG. 10 is a block diagram of a frequency synthesizer of an eighth embodiment of the invention.

FIG. 10 is a block diagram of a frequency synthesizer of the eighth embodiment of the invention.

In FIG. 10, the devices, circuit elements, and the like identical or equivalent to those shown in FIG. 7 are designated by the same reference numerals, and duplicated description is omitted. In the embodiment, the analog switch 60 is disposed between the phase comparator 3 and the loop filter 4.

The operation of the thus configured frequency synthesizer of the eighth embodiment will be described with reference to FIG. 10.

The output signal of the phase comparator 3 is input to the analog switch 60. The output of the analog switch 60 is input to the loop filter 4, and smoothed by the resistors and 456 and the capacitors 453, 455 and 457. The smoothed output is then input to the voltage controlled oscillator 1 as the control signal voltage. The high-frequency grounding capacitor 13 operates to prevent a high frequency signal of the voltage controlled oscillator from being transmitted toward the loop filter 4.

The capacitors 453, 455 and 457 are laminated film capacitors which show properties of a small change of the capacitance in response to an applied voltage and a small hysteresis.

As a result, all the capacitors existing between the analog switch 60 and the voltage controlled oscillator 1, except the high-frequency grounding capacitor 13 exhibit a small change of the capacitance with respect to the change of the voltage of the control signal of the voltage controlled oscillator 1. Even when the open loop state is set immediately after the switching of the frequency, therefore, the change of the control signal voltage of the voltage controlled oscillator 1 can be made small so that the change of the frequency of the output signal of the voltage controlled oscillator 1 is small.

As seen from the above description, according to the eighth embodiment of the invention, even when the open loop state is set immediately after the switching of the frequency, the change of the capacitance of the capacitors constituting the loop filter 4 is small. Therefore, the change of the control signal voltage of the voltage controlled oscillator can be made small so that the change of the frequency of the output signal of the voltage controlled oscillator is small.

Since all the capacitors exist between the analog switch 60 and the voltage controlled oscillator 1, moreover, the total capacitance of the capacitors which hold the control voltage during the open loop state is large and hence the operation is stabilized.

Next, a ninth embodiment of the invention will be described with reference to the drawings.

Figure 11:
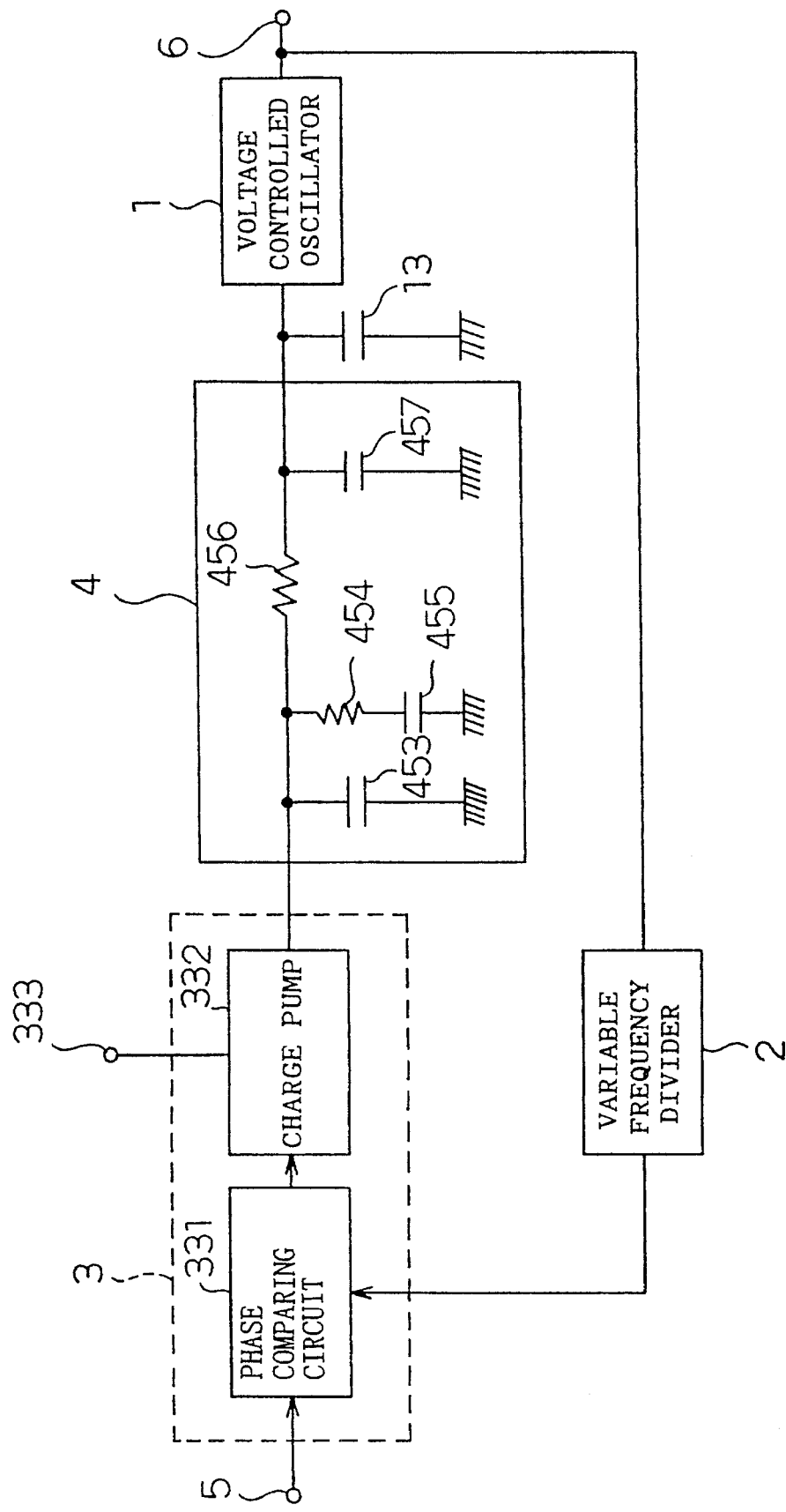
FIG. 11 is a block diagram of a frequency synthesizer of a ninth embodiment of the invention.

FIG. 11 is a block diagram of a frequency synthesizer of the ninth embodiment of the invention. The devices, circuit elements, and the like identical or equivalent to those shown in FIG. 7 are designated by the same reference numerals, and duplicated description is omitted. In FIG. 1, 331 designates a phase comparing circuit, 332 designates a charge pump, 333 designates a loop open/close control signal input terminal.

The operation of the thus configured frequency synthesizer of the ninth embodiment will be described with reference to FIG. 11.

The output signal of the variable frequency divider 2 is input to the phase comparing circuit 331 together with the reference frequency signal input to the reference frequency input terminal 5. Thereafter, a signal corresponding to the phase difference between the two frequency signals is input to the charge pump 332. The charge pump 332 operates in the following manner. When the phase of the output of the variable frequency divider leads, the output voltage is lowered during the period corresponding to the phase difference, and, when the phase lags, the output voltage is raised. During the other period, the output is set to be in the open state. The output of the charge pump 332 is input to the loop filter 4, and smoothed by the resistors 454 and 456 and the capacitors 453, 455 and 457. The smoothed output is then input to the voltage controlled oscillator 1 as the control signal voltage. The capacitors 453, 455 and 457 are laminated film capacitors which show properties of a small change of the capacitance in response to an applied voltage and a small hysteresis. The output of the charge pump 332 is forcedly set to be in the open state by the loop open/close control signal input to the loop open/close control signal input terminal 333, thereby attaining the open loop state.

All the capacitors existing between the charge pump 332 and the voltage controlled oscillator 1, except the high-frequency grounding capacitor 13 exhibit a small change of the capacitance with respect to the change of the voltage of the control signal of the voltage controlled oscillator 1. Even when the open loop state is set immediately after the switching of the frequency, therefore, the change of the control signal voltage of the voltage controlled oscillator 1 can be made small so that the change of the frequency of the output signal of the voltage controlled oscillator 1 is small.

As seen from the above description, according to the ninth embodiment of the invention, even when the open loop state is set immediately after the switching of the frequency, the change of the capacitance of the capacitors constituting the loop filter is small. Therefore, the change of the control signal voltage of the voltage controlled oscillator can be made small so that the change of the frequency of the output signal of the voltage controlled oscillator is small.

In the embodiment, moreover, the charge pump 332 serves also as the ON/OFF switch, and hence the number of elements can be reduced.

Next, a tenth embodiment of the invention will be described with reference to the drawings.

Figure 12:
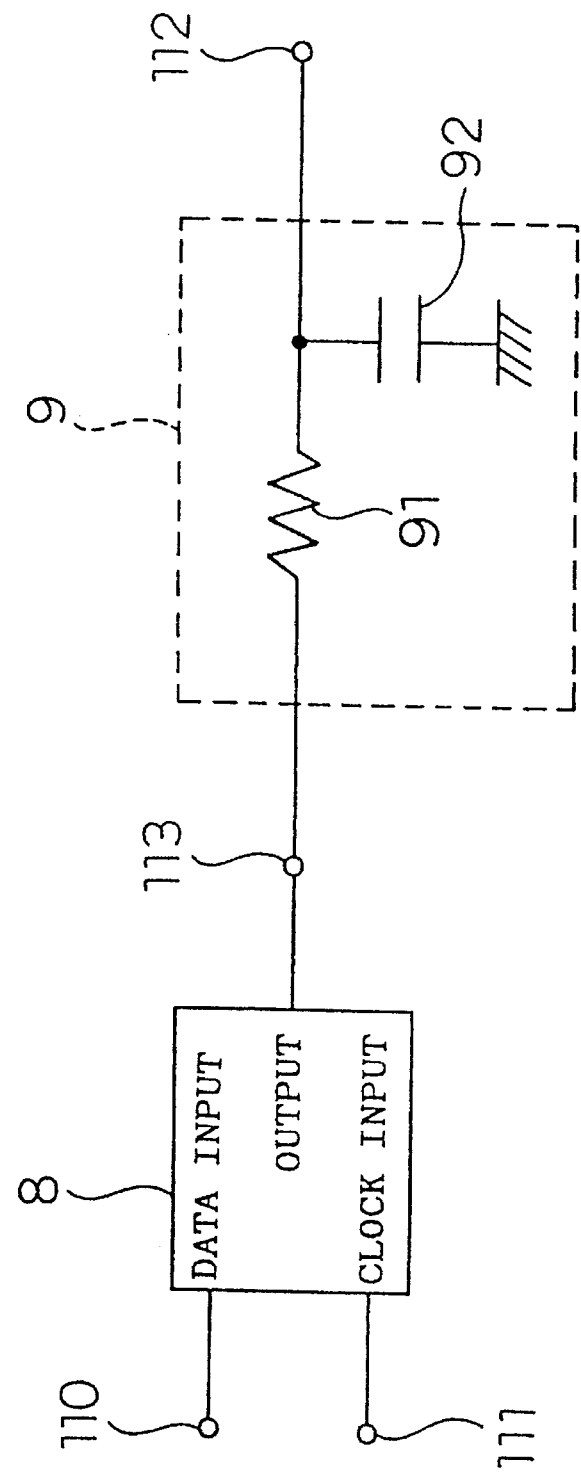
FIG. 12 is a block diagram showing a circuit which converts the loop open/close control signal into the switch control signal in a frequency synthesizer of a tenth embodiment of the invention.
Figure 13:
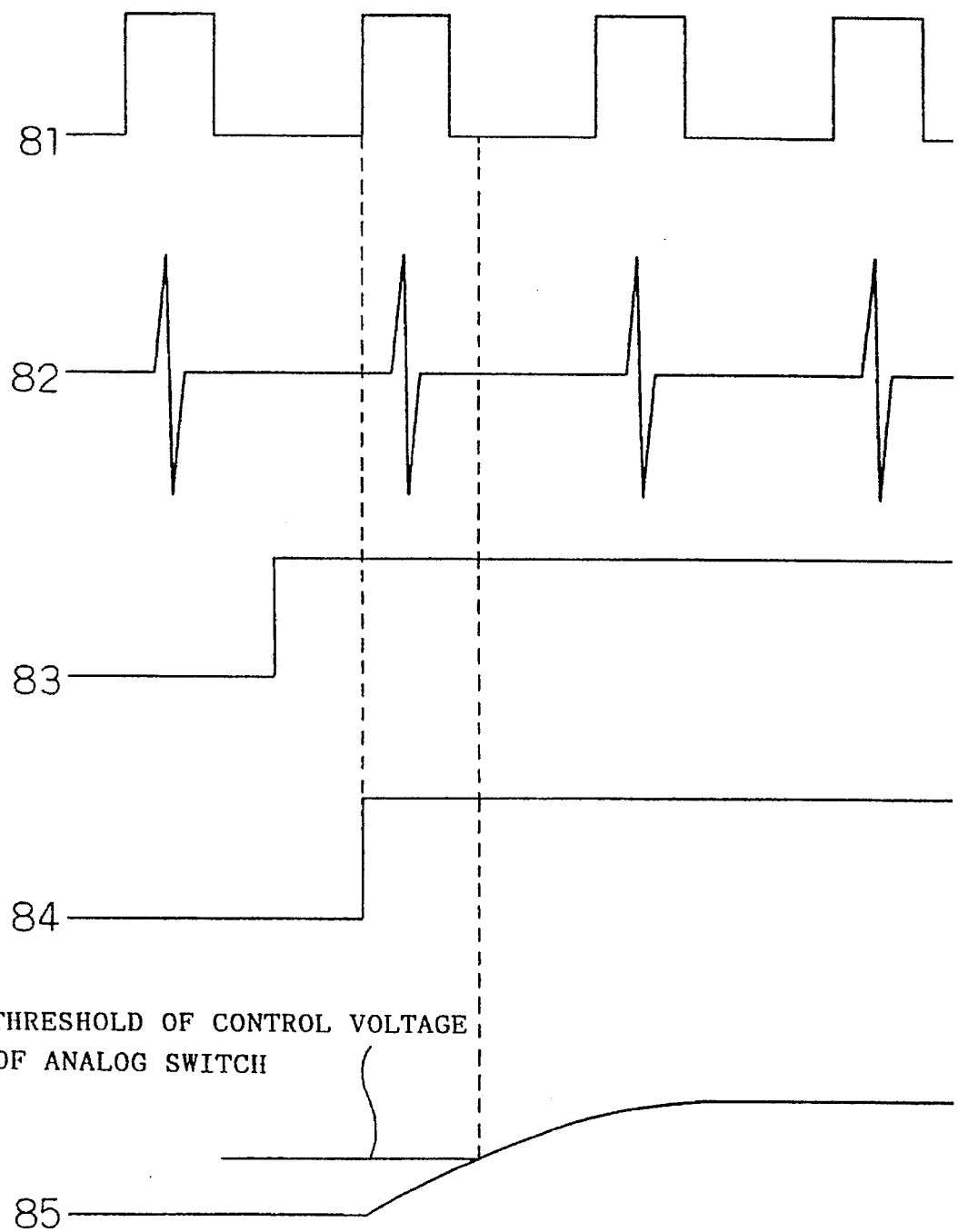
FIG. 13 is a timing chart of the tenth embodiment of the invention.

FIG. 12 shows a synchronizing circuit and a delay circuit which convert the loop open/close control signal into the switch control signal in the tenth embodiment of the invention, and FIG. 13 shows timings of signals. In FIG. 12, the devices, circuit elements, and the like identical or equivalent to those shown in FIG. 7 are designated by the same reference numerals, and duplicated description is omitted. In FIG. 12, 8 designates the synchronizing circuit consisting of a D type flip-flop, 9 designates the delay circuit, 91 designates a resistor, 92 designates a capacitor, 110 designates a loop open/close control signal input terminal, 111 designates a reference signal input terminal, 112 designates a switch control signal output terminal, and 113 designates an output terminal of the synchronizing circuit. In FIG. 13, 81 designates the waveform of the reference signal, 82 designates the waveform of the output of the charge pump, 83 designates the waveform of the loop control signal, 84 designates the waveform of the output signal of the synchronizing circuit, and 85 designates the waveform of the output signal of the delay circuit.

The operation of the thus configured frequency synthesizer of the tenth embodiment will be described with reference to FIGS. 12 and 13.

First, the loop open/close control signal input through the loop open/close control signal input terminal 110, and the reference signal input through the reference input terminal 111 are input as a data input and a clock input to the synchronizing circuit 8 of the D type flip-flop, respectively. In this case, the loop open/close control signal, and the reference signal are input to the synchronizing circuit 8 at the timings indicated in 83 and 81, respectively. The signal of the synchronizing circuit 8 is then output through the output terminal 113 of the synchronizing circuit at the timing indicated in 84. Thereafter, the output is input to the delay circuit 9, and delayed by a delay amount corresponding to the resistor 91 and the capacitor 92. The delayed signal is output through the switch control signal output terminal 112 at the timing indicated in 85.

Then the output of the delay circuit is input to the analog switch 60 as a switch open/close control signal. The timing when the signal level reaches the threshold of the control voltage of the analog switch 60 is set to a timing when the output 82 of the charge pump does not produce a signal. This setting can be performed by suitably selecting the values of the resistor 91 and the capacitor 92 constituting the delay circuit 9.

As seen from the above description, according to the tenth embodiment of the invention, the timing of inputting the loop open/close control signal is set to a timing when the output of the charge pump does not produce a signal. Even when the loop open/close control signal is input at an arbitrary timing to set the open loop state, therefore, the change of the control signal voltage of the voltage controlled oscillator 1 can be made small so that the change of the frequency of the output signal of the voltage controlled oscillator is small.

In the above, the configuration in which the synchronizing circuit and the delay circuit are applied to the eighth embodiment has been described. It is a matter of course that these circuits may be applied to the fifth, sixth, seventh, or ninth embodiment by operating in the same manner.

Next, an eleventh embodiment of the invention will be described with reference to the drawings.

Figure 14:
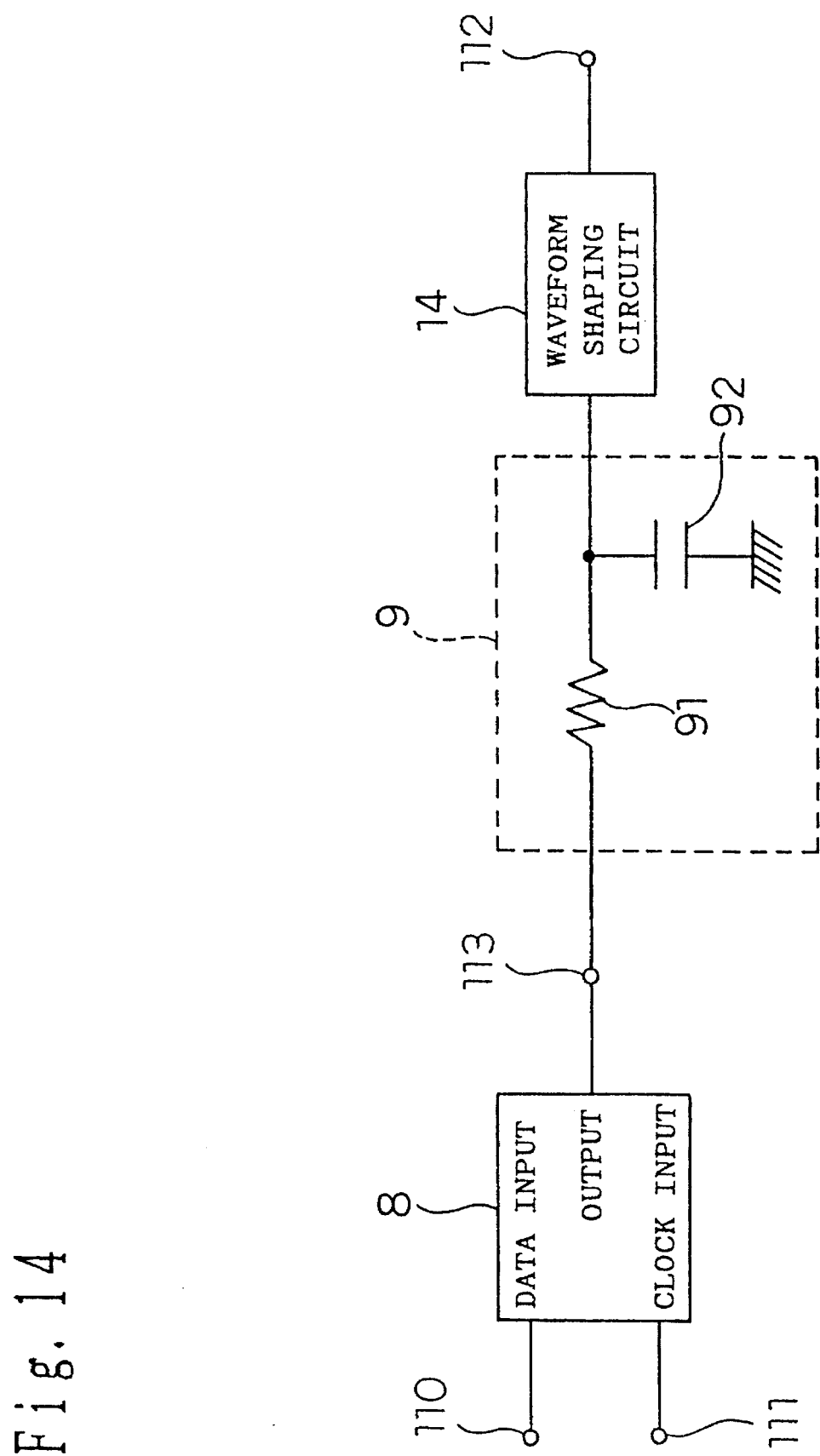
FIG. 14 is a block diagram showing a circuit which converts the loop open/close control signal into the switch control signal in a frequency synthesizer of an eleventh embodiment of the invention.
Figure 15:
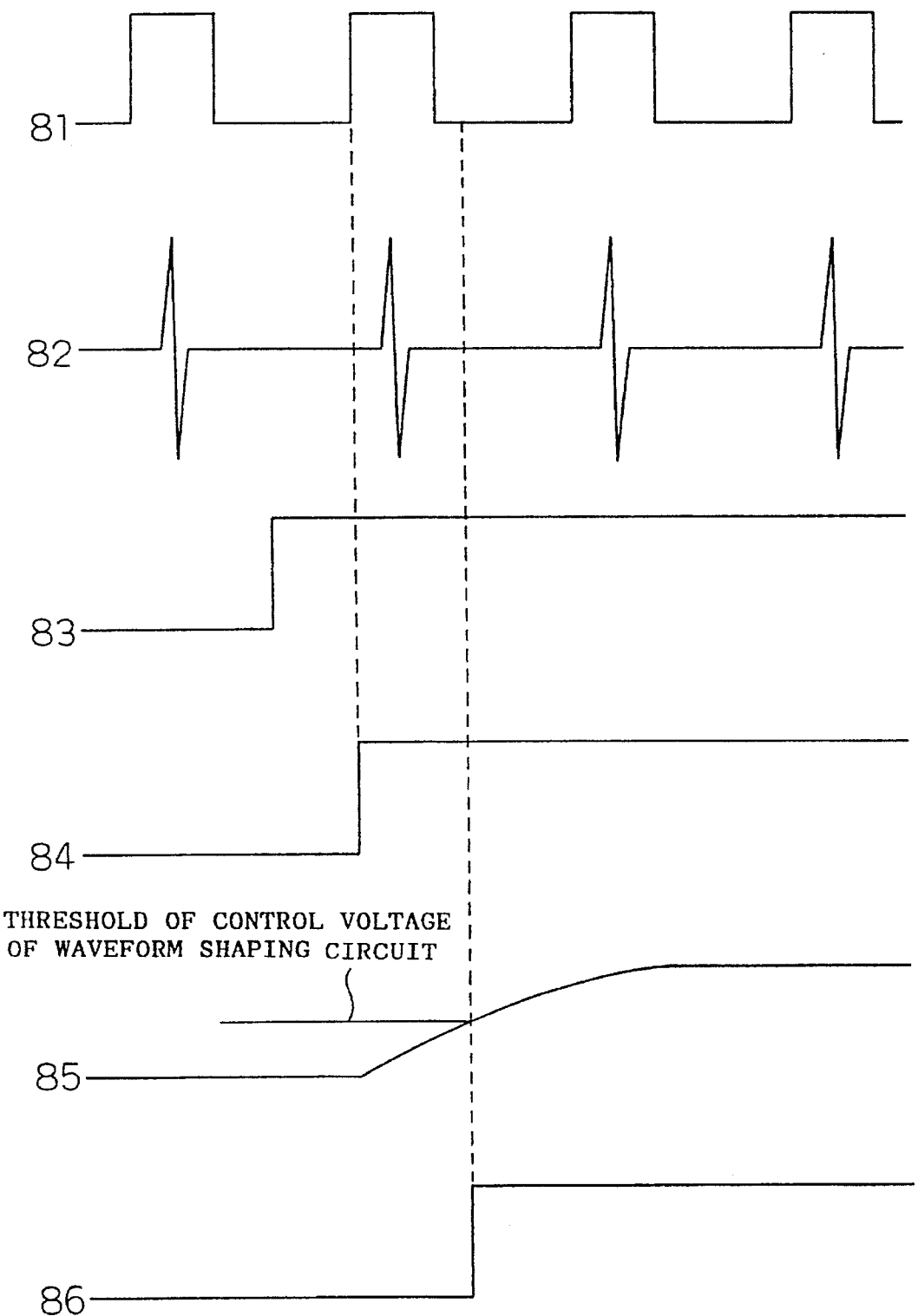
FIG. 15 is a timing chart of the eleventh embodiment of the invention.

FIG. 14 shows a synchronizing circuit and a delay circuit which convert the loop open/close control signal into the switch control signal in the eleventh embodiment of the invention, and FIG. 15 shows timings of signals. In FIGS. 14 and 15, the devices, circuit elements, and the like identical or equivalent to those shown in FIGS. 7, 12 and 13 are designated by the same reference numerals, and duplicated description is omitted.

In FIG. 14, 14 designates a waveform shaping circuit, and, in FIG. 15, 86 designates the waveform of the switch control signal which is an output signal of the waveform shaping circuit.

The operation of the thus configured frequency synthesizer of the eleventh embodiment will be described with reference to FIGS. 14 and 15.

The signal output from the delay circuit 9 is input to the waveform shaping circuit 14 which consists of usual logic gate or comparator. Depending on whether the output signal of the delay circuit 9 is higher than the threshold or not, the waveform shaping circuit outputs the switch control signal of HIGH or LOW. The timing of outputting the signal is indicated in 86.

The signal is then output through the switch control signal output terminal 112 as the switch control signal, and then input to the switch control signal input terminal 601 of the analog switch 60.

As seen from the above description, according to the eleventh embodiment of the invention, the timing of inputting the loop open/close control signal is set to a timing when the output of the charge pump does not produce a signal. Even when the loop open/close control signal is input at an arbitrary timing to set the open loop state, therefore, the change of the control signal voltage of the voltage controlled oscillator can be made small so that the change of the frequency of the output signal of the voltage controlled oscillator is small.

In the above, the configuration in which the timing control circuit is applied to the eighth embodiment has been described. It is a matter of course that the circuit may be applied to the fifth, sixth, seventh, or ninth embodiment by operating in the same manner.

The rising edge of the loop open/close control signal becomes steeper, and hence the uncertainty level of the switching is lowered so that the noise level is reduced.

Next, a twelfth embodiment of the invention will be described with reference to the drawings.

Figure 16:
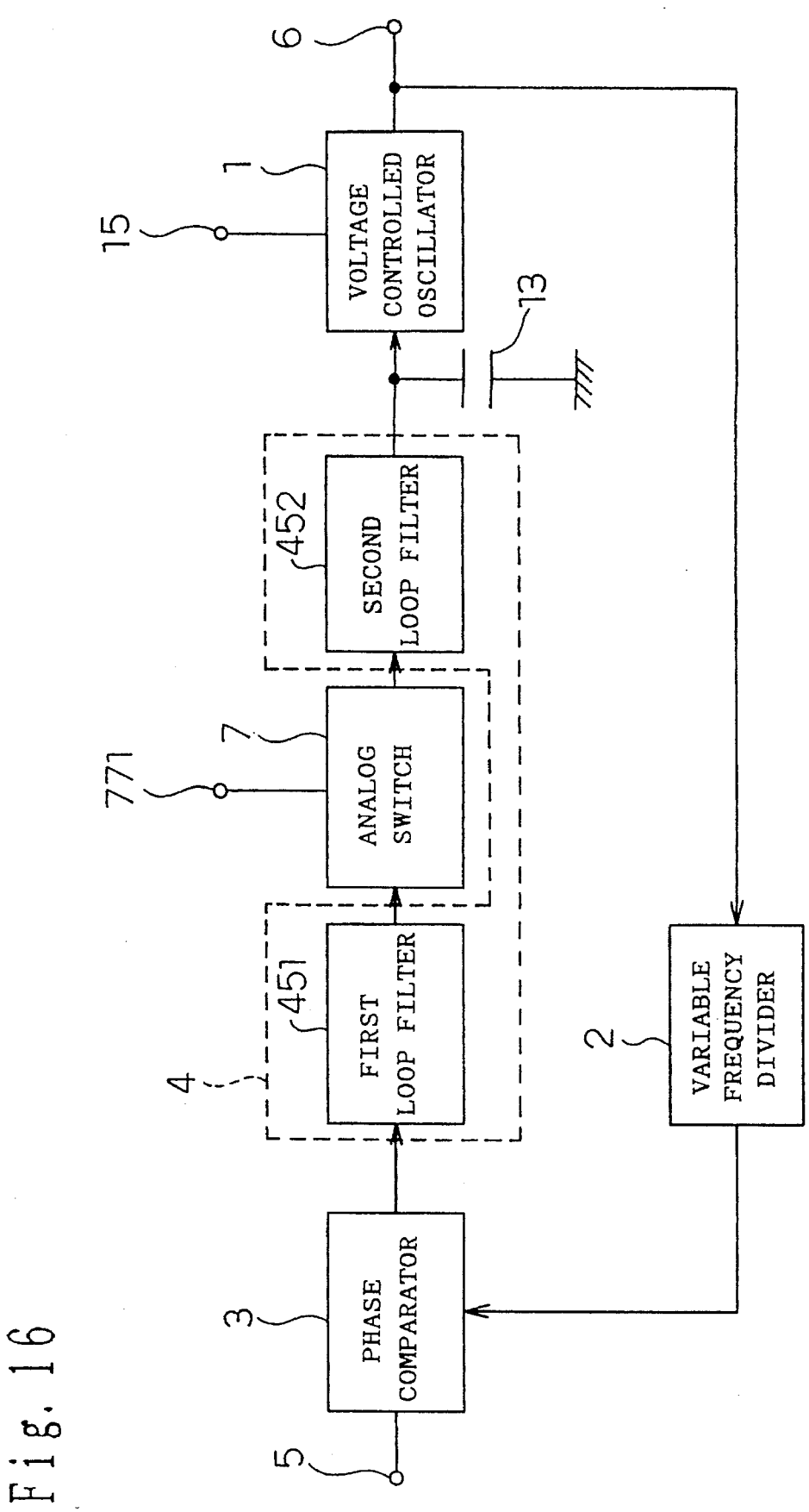
FIG. 16 is a block diagram of a frequency synthesizer of a twelfth embodiment of the invention.
Figure 17:
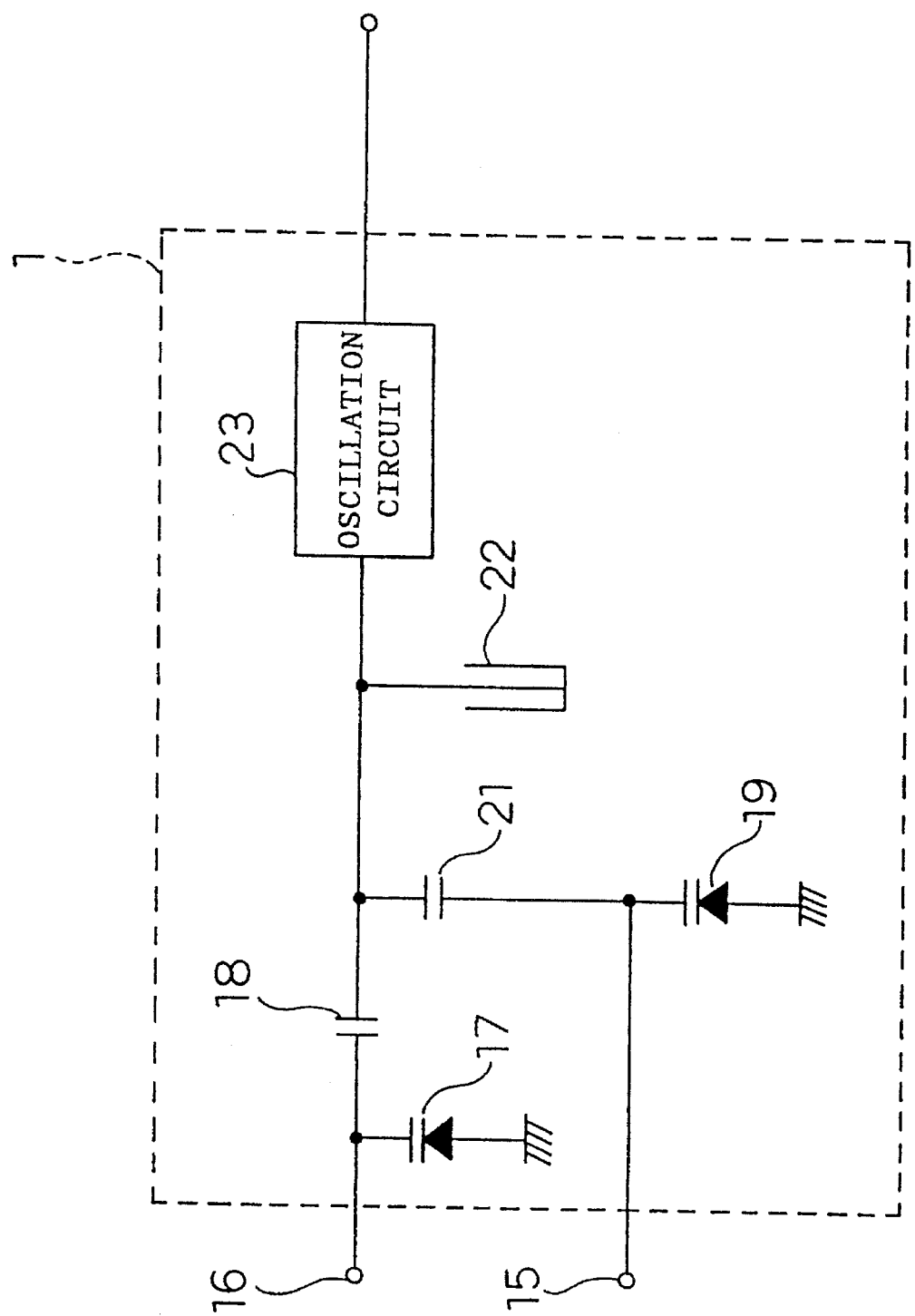
FIG. 17 is a diagram showing the configuration of a voltage controlled oscillator used in the twelfth embodiment of the invention.

FIG. 16 is a block diagram of a frequency synthesizer of the twelfth embodiment of the invention, and FIG. 17 is a diagram showing the configuration of a voltage controlled oscillator.

In FIGS. 16 and 17, the devices, circuit elements, and the like identical or equivalent to those shown in FIG. 7 are designated by the same reference numerals, and duplicated description is omitted. In the embodiment shown in FIG. 16, 15 designates a modulation signal input terminal, and, in FIG. 17, 16 designates a control signal voltage input terminal, 17 designates a first variable capacitance diode, 19 designates a second variable capacitance diode, 18 and 21 designate capacitors, 22 designates a resonator, and 23 designates an oscillation circuit.

The operation of the thus configured frequency synthesizer of the twelfth embodiment will be described with reference to FIGS. 16 and 17.

The output of the second loop filter 452 is input to the control signal voltage input terminal 16 of the voltage controlled oscillator 1. The capacitance of the first variable capacitance diode 17, one terminal of which is grounded, is determined by the control signal. The oscillation frequency of the oscillation circuit 23 is determined by the first variable capacitance diode 17 and the resonator 22 which are coupled to each other with respect to a high frequency, and the determined frequency is used as the output frequency of the voltage controlled oscillator 1.

The capacitance of the second variable capacitance diode 19, one terminal of which is grounded can be changed by the modulation signal input through the modulation signal input terminal 15. As a result, the oscillation frequency of the oscillation circuit 23 is determined by the first variable capacitance diode 17, the second variable capacitance diode 19, and the resonator 22 which are coupled to each other with respect to a high frequency. Furthermore, the output of the voltage controlled oscillator 1 may undergo also the frequency modulation.

Among capacitors existing between the analog switch 7 and the voltage controlled oscillator 1, all the capacitors except the high-frequency grounding capacitor 13 are laminated film capacitors which show properties of a small change of the capacitance in response to an applied voltage and a small hysteresis.

As a result, all the capacitors existing between the analog switch 7 and the voltage controlled oscillator 1, except the high-frequency grounding capacitor 13 exhibit a small change of the capacitance with respect to the change of the voltage of the control signal of the voltage controlled oscillator 1. Even when the open loop state is set immediately after the switching of the frequency, therefore, the change of the control signal voltage of the voltage controlled oscillator 1 can be made small so that the change of the frequency of the output signal of the voltage controlled oscillator 1 is small.

As seen from the above description, according to the twelfth embodiment of the invention, even when the open loop state is set immediately after the switching of the frequency, the change of the capacitance of the capacitors constituting the loop filter 4 is small. Therefore, the change of the control signal voltage of the voltage controlled oscillator can be made small so that the change of the frequency of the output signal of the voltage controlled oscillator is small.

Since the voltage controlled oscillator 1 is provided with the modulation signal input terminal 15, furthermore, the output signal of the voltage controlled oscillator may also undergo the modulation.

In the above, the configuration in which the modulation signal input terminal 15 is added to the voltage controlled oscillator 1 of the fifth embodiment has been described. Alternatively, the modulation signal input terminal 15 may be added to the voltage controlled oscillator 1 of the sixth, seventh, eighth, or ninth embodiment.

Next, a thirteenth embodiment of the invention will be described with reference to the drawings.

Figure 18:
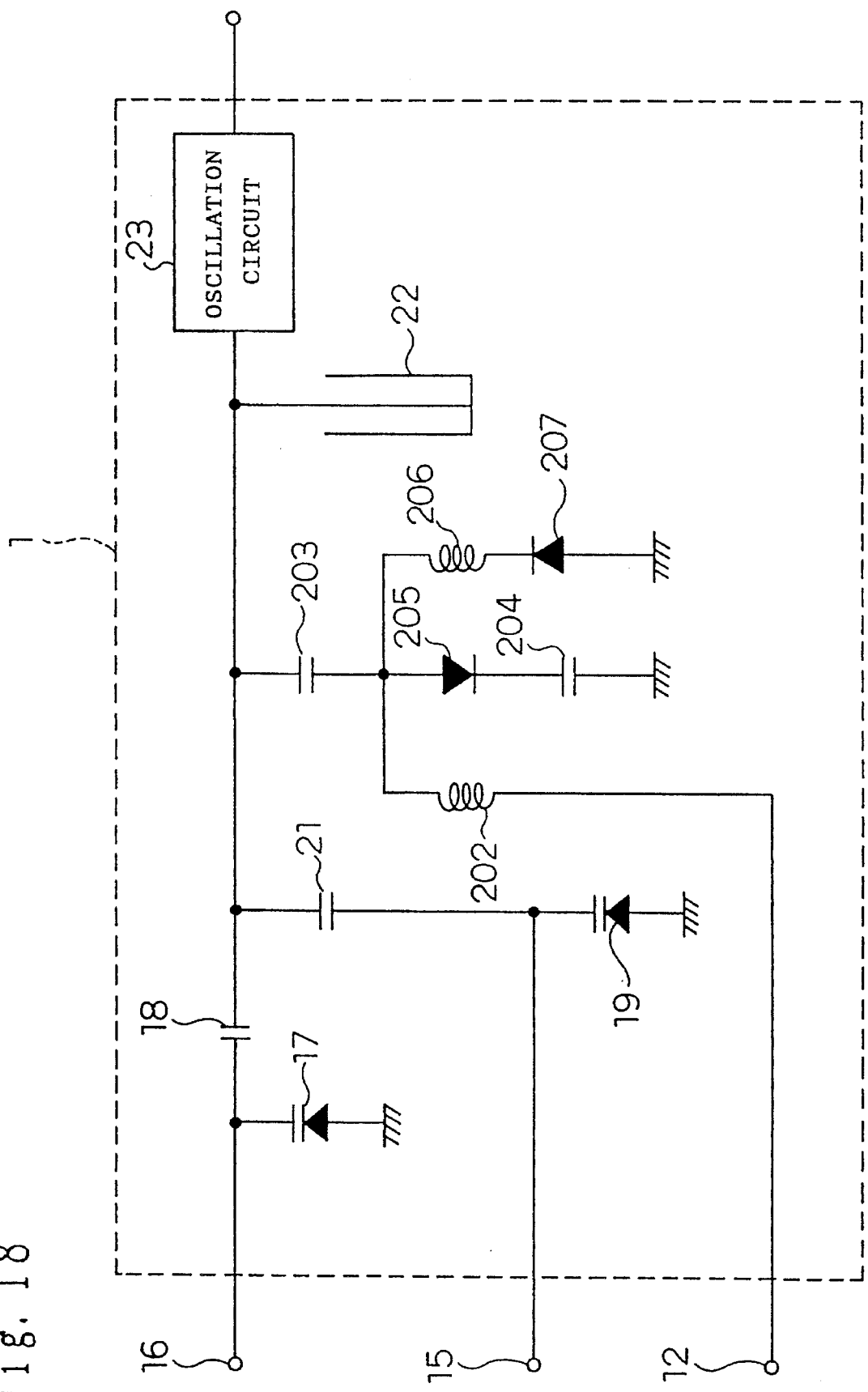
FIG. 18 is a diagram showing the configuration of a voltage controlled oscillator used in a thirteenth embodiment of the invention.

FIG. 18 is a diagram showing the configuration of a voltage controlled oscillator 1 used in the thirteenth embodiment of the invention.

In FIG. 18, the devices, circuit elements, and the like identical or equivalent to those shown in FIGS. 1 and 17 are designated by the same reference numerals, and duplicated description is omitted. In the embodiment of FIG. 18, 202 and 206 designate coils, 203 and 204 designate capacitors, and 205 and 207 designate diodes.

The operation of the thus configured frequency synthesizer of the thirteenth embodiment will be described with reference to FIG. 18.

The conductive/nonconductive state of the first diode 205, one terminal of which is grounded through the capacitor 204, can be changed by the control signal input through the second control signal input terminal 12. This allows the electrostatic capacitance of the resonator 22 of the voltage controlled oscillator 1 to be changed, so that two oscillation frequency ranges are switched. According to the circuit system, when the sign of the control signal input through the second control signal input terminal 12 is minus, the higher frequency range of the two oscillation frequency ranges is output, and, when the sign of the input signal is plus, the lower frequency range is output. The terminal of the first diode, which is not grounded, is connected to the second diode 207 through the coil 206. When the sign of the control signal input through the control signal input terminal 12 is changed from plus to minus, the second diode 207 causes the switching of the first diode 205 to rapidly rise.

Even when the feedback loop of the synthesizer is set to be in the open state immediately after the lower frequency range of the two oscillation frequency ranges is switched to the higher frequency range, therefore, the time required for switching the first diode 205 is short. This allows the change of the capacitance of the diode after the open loop state, even in the case where the period from the switching of the frequency range to the open loop state is short. Consequently, the change of the control signal of the voltage controlled oscillator after the open loop state can be made small so that the change of the frequency of the output signal of the voltage controlled oscillator is small. In the embodiment, the coils 202 and 206 are disposed in order to cut off the control signals with respect to a high frequency.

What is claimed is:

1. A frequency synthesizer comprising:

a voltage controlled oscillator in which an output oscillation frequency can continuously be changed in accordance with a value of a control signal voltage;

a variable frequency divider which divides a frequency of an output signal of said voltage controlled oscillator;

a phase comparator which compares a phase of an output signal of said variable frequency divider with a phase of a reference signal, and which outputs the control signal voltage;

a loop filter which limits a frequency band of an output signal of said phase comparator, said loop filter including at least one capacitor; and an ON/OFF switch which is disposed at a position closer to said phase comparator than at least a part of said loop filter, and which closes and opens a loop state consisting of said voltage controlled oscillator, said variable frequency divider, said phase comparator, and said loop filter, said at least one capacitor of said loop filter disposed between said ON/OFF switch and said voltage controlled oscillator having properties in which a capacitance change in response to an applied voltage is smaller than a predetermined value and hysteresis is smaller than a predetermined value.

2. A frequency synthesizer according to claim 1, wherein said at least one capacitor having properties in which a capacitance change in response to an applied voltage is smaller than the predetermined value and hysteresis is smaller than the predetermined value is a laminated film capacitor.

3. A frequency synthesizer according to claim 2, wherein said loop filter includes a first loop filter and a second loop filter, and said ON/OFF switch is connected in series between said first loop filter and said second loop filter, and turned ON and OFF in response to a loop open/close control signal, thereby switching a close loop state and an open loop state.

4. A frequency synthesizer according to claim 1, wherein
said loop filter includes a first loop filter and a second loop filter, and
said ON/OFF switch is connected in series between said first loop filter and said second loop filter, and turned ON and OFF in response to a loop open/close control signal, thereby switching a close loop state and an open loop state.

5. A frequency synthesizer according to claim 1, wherein
said ON/OFF switch is disposed between said phase comparator and said loop filter, and turned ON and OFF in response to a loop open/close control signal, thereby switching a close loop state and an open loop state.

6. A frequency synthesizer according to claim 2, wherein
said ON/OFF switch is disposed between said phase comparator and said loop filter, and turned ON and OFF in response to a loop open/close control signal, thereby switching a close loop state and an open loop state.

7. A frequency synthesizer according to claim 1, wherein
said phase comparator comprises:
a phase comparing circuit which compares the phase of the output signal of said variable frequency divider with the phase of the reference signal; and
a charge pump which outputs the control signal voltage on the basis of a result of the comparison, and
a function of said ON/OFF switch is conducted by holding an output of said charge pump to a high impedance state while the loop open/close control signal designates the open loop state.

8. A frequency synthesizer according to claim 2, wherein
said phase comparator comprises:
a phase comparing circuit which compares the phase of the output signal of said variable frequency divider with the phase of the reference signal; and
a charge pump which outputs the control signal voltage on the basis of a result of the comparison, and
a function of said ON/OFF switch is conducted by holding an output of said charge pump to a high impedance state while the loop open/close control signal designates the open loop state.

9. A frequency synthesizer according to claim 5, wherein said voltage controlled oscillator comprises a modulation signal input terminal, and receives a modulation signal through said modulation signal input terminal at an open loop state, thereby outputting a signal which undergoes frequency modulation in an open loop state.

10. A frequency synthesizer according to claim 2, wherein said voltage controlled oscillator comprises a modulation signal input terminal, and receives a modulation signal through said modulation signal input terminal at an open loop state, thereby outputting a signal which undergoes frequency modulation in an open loop state.

11. A frequency synthesizer according to claim 3, wherein said voltage controlled oscillator comprises a modulation signal input terminal, and receives a modulation signal through said modulation signal input terminal at an open loop state, thereby outputting a signal which undergoes frequency modulation in an open loop state.

12. A frequency synthesizer according to of claim 7, wherein said voltage controlled oscillator comprises a modulation signal input terminal, and receives a modulation signal through said modulation signal input terminal at an open loop state, thereby outputting a signal which undergoes frequency modulation in an open loop state.

13. A frequency synthesizer according to claim 1, wherein said voltage controlled oscillator comprises a modulation signal input terminal, and receives a modulation signal through said modulation signal input terminal at an open loop state, thereby outputting a signal which undergoes frequency modulation in an open loop state.

14. A frequency synthesizer according to claim 5, wherein said voltage controlled oscillator has a plurality of oscillation frequency ranges that can be switched in accordance with a switch control signal, and the plurality of oscillation frequency ranges are switched by switching a capacitance of a capacitor in a voltage controlled oscillator resonating circuit.

15. A frequency synthesizer according to claim 2, wherein said voltage controlled oscillator has a plurality of oscillation frequency ranges that can be switched in accordance with a switch control signal, and the plurality of oscillation frequency ranges are switched by switching a capacitance of a capacitor in a voltage controlled oscillator resonating circuit.

16. A frequency synthesizer according to claim 3, wherein said voltage controlled oscillator has a plurality of oscillation frequency ranges that can be switched in accordance with a switch control signal, and the plurality of oscillation frequency ranges are switched by switching a capacitance of a capacitor in a voltage controlled oscillator resonating circuit.

17. A frequency synthesizer according to claim 7, wherein said voltage controlled oscillator has a plurality of oscillation frequency ranges that can be switched in accordance with a switch control signal, and the plurality of oscillation frequency ranges are switched by switching a capacitance of a capacitor in a voltage controlled oscillator resonating circuit.

18. A frequency synthesizer according to claim 1, wherein said voltage controlled oscillator has a plurality of oscillation frequency ranges that can be switched in accordance with a switch control signal, and the plurality of oscillation frequency ranges are switched by switching a capacitance of a capacitor in a voltage controlled oscillator resonating circuit.

19. A frequency synthesizer according to claim 14, wherein said voltage controlled oscillator includes a semiconductor switch for switching the capacitance of the capacitor in said resonating circuit.

20. A frequency synthesizer according to claim 19, wherein said semiconductor switch is a diode switch.

21. A frequency synthesizer according to claim 20, wherein a second diode, one terminal of which is grounded, is reversely connected in parallel to the first diode switch, thereby allowing a change of the oscillation frequency to be small even when a feedback loop is opened immediately after the output oscillation frequency ranges of said voltage controlled oscillator are switched.

22. A frequency synthesizer comprising:
a voltage controlled oscillator in which an output oscillation frequency can continuously be changed in accordance with a value of a control signal voltage;

a variable frequency divider which divides a frequency of an output signal of said voltage controlled oscillator;

a phase comparator which compares a phase of an output signal of said variable frequency divider with a phase of a reference signal, and which outputs the control signal voltage;

a loop filter which limits a frequency band of an output signal of said phase comparator;

an ON/OFF switch which closes and opens a loop consisting of said voltage controlled oscillator, said variable frequency divider, said phase comparator, and said loop filter;

a synchronizing circuit which outputs a loop open/close control signal for opening and closing the loop, in synchronization with the reference signal; and a delay circuit which delays an output of said synchronizing circuit, thereby outputting a switch control signal to said ON/OFF switch, said delay circuit outputting the switch control signal while the output of the phase comparator in the closed loop is in a high impedance state.

23. A frequency synthesizer according to claim 22, wherein said delay circuit includes a time constant circuit having a resistor connected in series and a capacitor connected in parallel, and a waveform shaping circuit which outputs a switch control signal of a HIGH level or a LOW level in response to an output voltage of said time constant circuit.

* * * * *